United States Patent [19]
Miki et al.

[11] Patent Number: 5,828,157
[45] Date of Patent: Oct. 27, 1998

[54] PIEZOELECTRIC ACTUATOR AND PYROELECTRIC TYPE INFRARED RAY SENSOR USING THE SAME

[75] Inventors: Katsumasa Miki, Neyagawa; Koji Nomura, Shijonawate; Takeshi Masutani, Moriguchi, all of Japan

[73] Assignee: Matsushita Electric Industrial Co., Ltd., Osaka, Japan

[21] Appl. No.: 666,317

[22] PCT Filed: Nov. 7, 1995

[86] PCT No.: PCT/JP95/02267

§ 371 Date: Sep. 30, 1996

§ 102(e) Date: Sep. 30, 1996

[87] PCT Pub. No.: WO96/14687

PCT Pub. Date: May 17, 1996

[30] Foreign Application Priority Data

Nov. 7, 1994 [JP] Japan .................................. 6-272048

[51] Int. Cl.⁶ .................................................. H01L 41/08
[52] U.S. Cl. ............................................. 310/328; 310/321
[58] Field of Search .................................. 310/321, 322, 310/328

[56] References Cited

U.S. PATENT DOCUMENTS

| | | | |
|---|---|---|---|
| 4,966,032 | 10/1990 | Takeuchi | 73/64 |
| 5,216,313 | 6/1993 | Ohnishi et al. | 310/323 |
| 5,561,337 | 10/1996 | Toda | 310/323 |

FOREIGN PATENT DOCUMENTS

| | | | |
|---|---|---|---|
| 60-18980 | 1/1985 | Japan | 310/328 |
| 4-91665 | 3/1992 | Japan | 310/328 |

*Primary Examiner*—Thomas M. Dougherty
*Attorney, Agent, or Firm*—McDermott, Will & Emery

[57] ABSTRACT

The present invention is a piezoelectric actuator for stabilizing the driving of a small-sized chopper, thereby enhancing reliability of a pyroelectric type infrared ray sensor, wherein actuator is a unimorph type actuator having a piezoelectric element adhered to a shim. The shim and a displacement magnifying part are bound in a U-form. The resonance frequencies due to the vibrations of the unimorph type actuator and the displacement magifying part are brought close to each other wherein the chopper is driven at an intermediate frequency. As a result, a stable displacement magnifying effect is obtained at the front end of the displacement magnifying part.

23 Claims, 20 Drawing Sheets

PIEZOELECTRIC ACTUATOR AND PYROELECTRIC TYPE INFRARED RAY SENSOR USING THE SAME

FIELD OF THE INVENTION

The present invention relates to a pyroelectric type infrared ray sensor for detecting an infrared ray released from an object without making contact, and a piezoelectric actuator which is a vibrating mechanism used as a chopper of such pyroelectric infrared ray.

BACKGROUND OF THE INVENTION AND RELATED ART STATEMENT

Recently, the pyroelectric type infrared ray sensor is used in wide fields including measurement of temperature of foods in microwave ovens, and detecting the position of human bodies in air-conditioned, and its demand seems to increase further henceforth. The pyroelectric type infrared ray sensor makes use of the pyroelectric effect by a pyroelectric element such as single crystal of $LiTaO_3$. The pyroelectric element has a spontaneous polarization, and is always generating surface electric charge, but maintains an electrically neutral state in the atmospheric stationary state by bonding with the electric charge in the atmosphere. When an infrared ray enters this pyroelectric element, the temperature of the pyroelectric element is changed, and accordingly the surface electric charge state is broken and changed from the neutral state. It is the pyroelectric type infrared ray sensor that is a device for detecting the electric charge generated on the surface and measuring the infrared ray incident amount. An object radiates an infrared ray depending on its temperature, and the position or temperature of the object can be detected by using this sensor. The pyroelectric effect is derived from the change of incident amount of infrared ray, and when detecting the temperature of an object as pyroelectric type infrared ray sensor, it is required to vary the infrared ray incident amount. What is used as this means is called a chopper, and it interrupts the incident infrared ray by force, and detects the temperature of the detecting object. As a conventional chopper, for example, an electromagnetic motor or piezoelectric actuator was used.

FIG. 13 is a perspective view of a prior art of pyroelectric type infrared ray sensor using a piezoelectric actuator having a piezoelectric element adhered to an elastic flat plate as the chopper. Generally, the actuator composing an adhered element by adhering a piezoelectric element to an elastic flat plate of metal or the like, fixing one end of the adhered element, and generating a flexural motion on the entire surface by making use of distortion by the piezoelectric element. This use of distortion by piezoelectric element is called bimorph type if the piezoelectric element is adhered to both sides of the elastic flat plate, or unimorph type if adhered to one side only, and the elastic flat plate is known as shim, and hereinafter these members are called in this manner.

FIG. 13 represents a piezoelectric actuator using a bimorph type element as chopper for pyroelectric type infrared ray sensor, wherein reference numeral 201 is a shim, 202a, 202b are piezoelectric elements, 203 is a shield plate, 204 is a base, 205 is a fixing piece, 206 is a wiring for shim, 207a, 207b are wirings for piezoelectric elements, 208 is an infrared ray detecting unit, 209 is a slit, and 210 is an infrared ray. On both sides of the shim 201 of elastic metal, piezoelectric elements 202a, 202b are adhered, and these three pieces are combined into one body, and a bimorph type element is composed. Electrodes are printed on the surface of the piezoelectric elements 202a, 202b. The adhesive surface is polarized in the vertical direction. The individual polarizing directions of the piezoelectric elements 202a, 202b are set by the direction of electric field applied between the shim 201 and the piezoelectric elements 202a, 202b by the wiring 206 taken out from the shim and the wirings 207a, 207b taken out from the piezoelectric elements, and are determined so that the piezoelectric elements 202a, 202b may always generate distortion in mutually reverse directions. That is, the direction of applied electric field and polarizing direction are determined so that when one of the piezoelectric elements 202a, 202b distorts in a direction extending in the polarizing direction, the other may contract in the polarizing direction. The bimorph type element is fixed and held as part of the shim 201 and part of the piezoelectric elements 202a, 202b are simultaneously pinched between the base 204 and fixing piece 205. In the portion of the shim 201 where the piezoelectric elements 202a, 202b are not adhered, the wiring for shim 206 is fitted, and on the surface of the piezoelectric elements 202a, 202b, the wirings for piezoelectric elements 207a, 207b are fitted. The shield plate 203 is fitted to the front end portion at the free end of the bimorph type element, and the slit 209 is formed in the shield plate 203. Near the shield plate 203, the infrared ray detecting unit 208 is disposed so as not to contact with the shield plate 203 and bimorph type element. When an electric field is applied between the shim 201 and piezoelectric elements 202a, 202b through the wiring for shim 206 and wirings for piezoelectric elements 207a, 207b, the bimorph type elements generates a flexural motion fixed at one end, and the shield plate 203 and slit 209 provided at the front end make reciprocal motions (vibrations) depending on the changes of the electric field applied direction. By the reciprocal motions of the slit 209, the infrared ray 210 entering the infrared ray detecting unit 208 is interrupted.

In the bimorph type chopper of this structure, however, in order to obtain a sufficient moving distance for interrupting the infrared ray, the dimension from the fixing part to the front end moving part must be extended, and a very high driving voltage is needed.

Accordingly, in a conventional improving method, by forming a charging load in the front end moving part of the bimorph type element or unimorph type element, the resonance frequency is lowered, and by fixing only in the shim part, brittle breakdown of the piezoelectric elements is prevented. Moreover, as required, by further lowering the resonance frequency by such means as a notch provided in the shim near the fixing part, it was hitherto attempted to improve by obtaining a large displacement by low voltage driving. An example of structure of the chopper having the above features is described below.

FIG. 14 is a perspective view showing an example of forming the unimorph type element as chopper for pyroelectric type infrared ray sensor, so that the width of the fixing place of the shim part may be narrow, in a prior improved art. In FIG. 14, reference numerals 211a, 211b are shims, 212a, 212b are piezoelectric elements, 213a, 213b are weights, 214 is a sensor base, 215a, 215b are unimorph type element fixing pieces, 216a, 216b are wirings for shims, 217a, 217b are wirings for piezoelectric elements, 218 is an infrared ray detecting unit, 219a, 219b are unimorph type element fixing screws, and 220 is an infrared ray.

FIG. 15 is a perspective view showing the detail of the shims 211a, 211b used in this improved example, in which reference numeral 221 is a shield part, 222 is a piezoelectric element adhering part, 223 is a notch, 224 is a positioning part, and 225a, 225b are fixing holes. The shield part 221 and piezoelectric element adhering part 222 are bent to form a right angle, and the notch 223 is provided so that the width from the piezoelectric element adhering part 222 to the positioning part 224 may be formed smaller than the piezoelectric element adhering part 222, and the fixing holes 225a, 225b are provided at both ends of the positioning part 224.

The shim 211a and the shim 211b respectively form a narrow width notch 223 as shown in FIG. 15, and beneath the notch 223, as shown in FIG. 14, they are held between the sensor base 214 and unimorph type element fixing pieces 215a, 215b. Moreover, the shim 211a and shim 211b are positioned by inserting the unimorph type element fixing screws 219a, 219b into fixing holes 225a, 225b of individual shims, and with one end fixed, they are disposed so as to face parallel to each other and be in stagger. Further, on the side of the shim facing the other shim, that is, on the piezoelectric element adhering part 222, the piezoelectric elements 212a, 212bare adhered at positions not contacting with the sensor base 214, unimorph type element fixing pieces 215a, 215b, and shield parts at front ends of shims 211a, 211b. The unimorph type piezoelectric actuator is composed in this manner. The infrared ray detecting unit 218 is disposed near the free end of the unimorph type element on the sensor base 214, so that incidence or interruption of infrared ray 220 may be detected. The shield part for interrupting the infrared ray 220 is composed by bending the fixing side of the shims 211a, 211b and the opposite side end portions, and weights 213a, 213b are adhered in the flat area of these portions. At one position other than the movable parts of the shims 211a, 211b, that is, at one position of the positioning part 224, wirings for shim 216a, 216b are provided, and wirings for piezoelectric elements 217a, 217b are fitted to the piezoelectric elements 212a, 212b at positions near the fixing part of the unimorph type element. When an electric field is applied between the shim 211a and piezoelectric element 212a, and between the shim 211b and piezoelectric element 212b, respectively, through the wirings for shims 216a, 216b, and wirings for piezoelectric elements 217a, 217b, the unimorph type element causes bending, and the shield part at the front end moves. Two unimorph type elements are vibrated in opposite directions at same frequency, and the infrared ray 220 is interrupted intermittently. In such constitution and action, the incident path of infrared ray is opened and closed, and the amplitude is smaller than in the prior art of parallel moving of slit.

By forming a notch in the shim between the piezoelectric element and fixing part of the unimorph type element, as compared with the unimorph type element of same dimensions without notch, the resonance frequency can be lowered, and therefore, as compared with the constitution without notch, reduction of chopper size, and increase of displacement in low frequency driving are realized.

Nevertheless, the bimorph type or unimorph type piezoelectric actuator having a notch and a weight at the front end portion in the improved example of prior art is generally driven near resonance frequency. Therefore, if the resonance frequency varies among individual elements when driving, a large difference of displacement occurs, and it required, in order to keep the displacement constant, fine adjustment and high precision in processing and assembling of parts. Or, if the resonance frequency changes in the course of time, the amount of displacement may change extremely. Such problems were not limited to the conventional choppers, but were common problems in the applications of resonance.

In the light of the above problems, it is hence a primary object of the invention to present a piezoelectric actuator further stable in displacement and using resonance not requiring fine adjustment, and a pyroelectric type infrared ray sensor using the same.

SUMMARY OF THE INVENTION

Aforementioned problems, the piezoelectric actuator of the invention is constituted by fitting a member for magnifying the displacement to the front end portion of the piezoelectric element adhering part adhering the piezoelectric element and elastic member, disposing the member for magnifying the displacement (displacement magnifying part) in a direction from the fitting part of the front end of the portion adhering the piezoelectric element (piezoelectric element adhering part) toward the fixing part, with the resonance frequencies of the both members close to each other, and vibrating at an intermediate frequency of both resonance frequencies.

The pyroelectric type infrared ray sensor of the invention comprises a piezoelectric actuator constituted by fitting a member for magnifying the displacement to the front end portion of the piezoelectric element adhering part adhering the piezoelectric element and elastic member, disposing the member for magnifying the displacement (displacement magnifying part) in a direction from the fitting part of the front end of the portion adhering the piezoelectric element (piezoelectric element adhering part) toward the fixing part, with the resonance frequencies of the both members close to each other, and vibrating at an intermediate frequency of both resonance frequencies, and a pyroelectric type infrared ray detecting unit provided near the piezoelectric actuator, wherein the piezoelectric actuator is used as intermittent incident means of infrared ray entering the infrared ray detecting unit.

In this constitution, by disposing the displacement magnifying part in a direction from the fitting part of the front end of the piezoelectric element adhering part toward the fixing part, the entire structure may be reduced in size. Besides, by setting the driving frequency at an intermediate frequency of the both resonance frequencies, a displacement magnifying effect by plural resonances is obtained. Still more, since the resonance frequency derived from the displacement magnifying part is defined to be higher than the resonance frequency derived from the piezoelectric element adhering part, a stabler vibration with less change in the time course is obtained at the front end of the displacement magnifying part.

DETAILED DESCRIPTION OF PREFERRED EMBODIMENT (Embodiment 1)

A first embodiment of the invention is described below.

Figure 1:
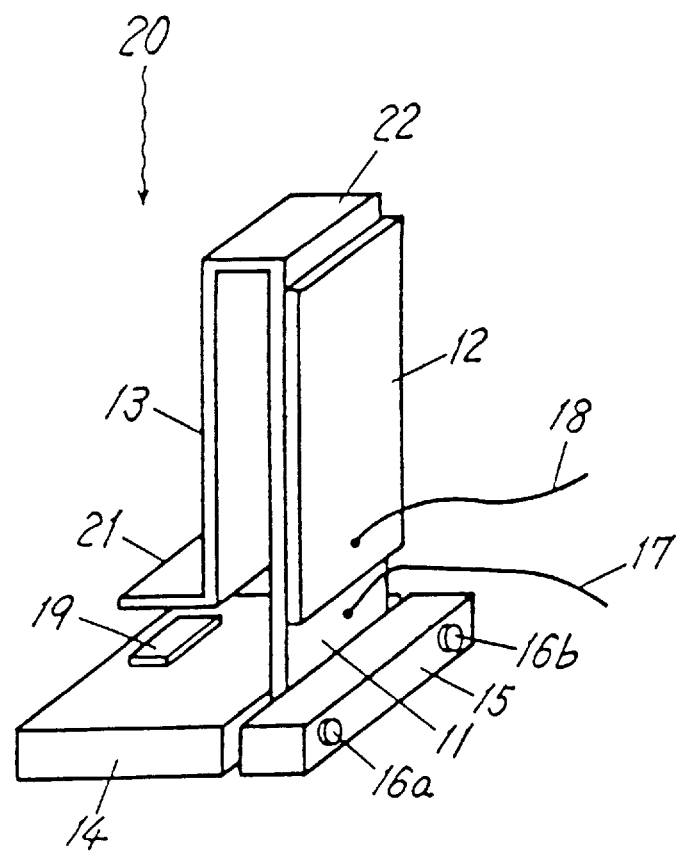
FIG. 1 is a perspective view showing a constitution of a piezoelectric actuator in a first embodiment of the invention.

FIG. 1 is a perspective showing an example of chopper for pyroelectric type infrared ray sensor using a unimorph type piezoelectric actuator in the first embodiment of the invention.

In FIG. 1, reference numeral 11 is a shim, 12 is a piezoelectric element, 13 is a displacement magnifying part, 14 is a sensor base, 15 is a fixing piece, 16a, 16b are fixing screws, 17 is a wiring for shim, 18 is a wiring for piezoelectric element, 19 is an infrared ray detecting unit, 20 is an infrared ray, 21 is a bending part, and 22 is a binding part.

By bending an elastic flat plate of phosphor bronze or the like in a pi-shape, the shim 11 and displacement magnifying part 13 are formed integrally. The shim 11 and displacement magnifying part 13 are parallel to each other, and have a longitudinal dimension in the same direction from the binding part (folding part) 22. Moreover, in the displacement magnifying part 13, the binding part 22 and the opposite front end are at right angle, and the bending part 21 is formed on the opposite side of the shim 11. On the surface of the shim 11, the piezoelectric element 12 is adhered, and the piezoelectric element adhering part (unimorph type element) is formed. The shim 11 is held between the sensor base 14 and fixing piece 15, near the end of the opposite side of the binding part with the displacement magnifying part 13. Moreover, in the sensor base 14, female threads are cut, and a hole is processed in the fixing piece 15, so that the shim 11 is fixed by fixing screws 16a, 16b. The infrared ray detecting unit 19 is disposed on the sensor base 14, and is positioned near the bending part of the front end of the displacement magnifying part 13. In addition, near the fixing part of the shim 11, the wiring for shim 17 is fitted, and the wiring for piezoelectric element 18 is fitted at a position near the fixing part of the shim 11, on the opposite surface of the adhesion side of the piezoelectric element 12. When an alternating-current signal is applied through the wiring for shim 17 and wiring for piezoelectric element 18, a potential difference occurs between the shim 11 and piezoelectric element 12, and the binding part of the piezoelectric element adhering part with the displacement magnifying part 13 is displaced, and the bending part 21 at the front end of the displacement magnifying part is also displaced depending on this displacement. By this motion, the infrared ray detecting unit 19 intermittently interrupts the incident infrared ray 20, and plays the role of a chopper.

Figure 2:
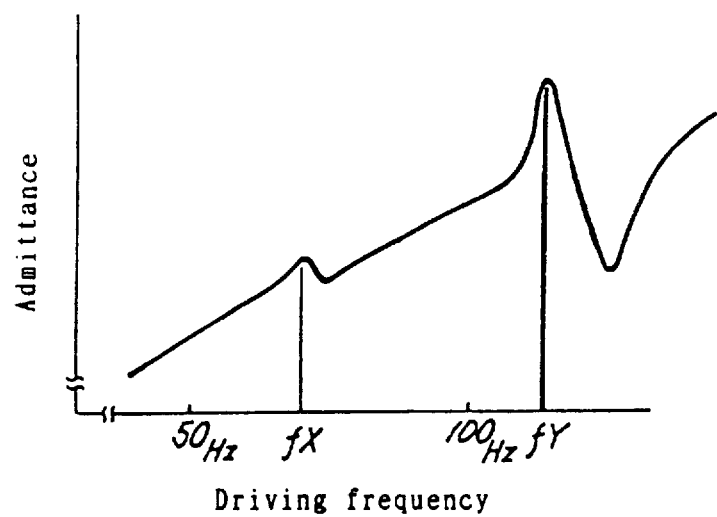
FIG. 2 is a resonance characteristic diagram of the piezoelectric actuator in the constitution of the first embodiment of the invention.

Herein, the resonance characteristic of the piezoelectric actuator having such constitution is shown in FIG. 2.

FIG. 2 is an example of resonance characteristic of the piezoelectric actuator composed of a pi-shaped bent shim and displacement magnifying part, in which the axis of ordinates denotes the admittance, and the axis of abscissas represents the driving frequency. It is known that resonance phenomenon takes place at frequencies fX and fY. The resonance at fX and fY is either the resonance due to vibration of the piezoelectric actuator, especially the piezoelectric element adhering part, or the resonance due to vibration of mainly the displacement magnifying part, which may be determined depending on the constitution of the piezoelectric actuator. Also depending on the constitution of the piezoelectric actuator, the difference of fX and fY varies. As mentioned above, as the shim and displacement magnifying part are constituted to have a longitudinal dimension in a same direction from the binding part, control of relative positions of fX and fY will be easy. For example, when the longitudinal dimension of the displacement magnifying part is constant and only the length from the fixing part of the piezoelectric element adhering part to the piezoelectric element is changed (that is, when the longitudinal dimension of the piezoelectric element adhering part only is changed), if the resonance frequency derived from the piezoelectric element adhering part corresponds to fY in the state of short longitudinal dimension of the initial piezoelectric element adhering part (that is, if the resonance frequency derived from the piezoelectric element adhering part is higher than the resonance frequency derived from the displacement magnifying part), as the longitudinal dimension of the piezoelectric element adhering part is gradually extended, both of the resonance frequencies come relatively closer to each other, and both overlap as one resonance at a certain length. When the longitudinal dimension of the piezoelectric element adhering part is longer, the relative positions of the two are inverted, and the resonance frequency due to the displacement magnifying part becomes higher than the resonance frequency due to the piezoelectric element adhering part.

Figure 3:
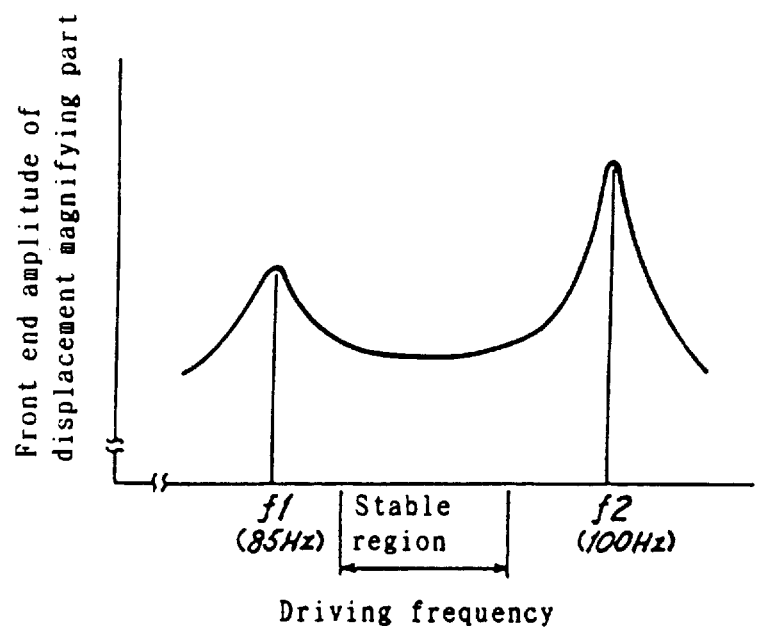
FIG. 3 is a displacement characteristic diagram of the piezoelectric actuator in the constitution of the first embodiment of the invention.

In this way, in the constitution of bringing fX and fY closer to each other, the relation between the displacement of the displacement magnifying part front end and the driving frequency is shown in FIG. 3. In FIG. 3, the axis of ordinates shows the displacement (amplitude) of the displacement magnifying part front end portion, and the axis of abscissas indicates the driving frequency. The scale of the axis of abscissas is about one-third of FIG. 2. At the driving frequency between fX and fY, the displacement is magnified by the effect of both resonances, and it is known that there is a frequency region of relatively stable displacement amount. Hence, by bringing fX and fY closer to each other and driving at an intermediate frequency of both frequencies, both displacement magnifying effect by resonance and stable amplitude are obtained.

Incidentally, defining fX to be resonance frequency f1 derived mainly from the piezoelectric element adhering part, and fY to be resonance frequency f2 derived mainly from the displacement magnifying part, that is, in the constitution where the resonance frequency derived mainly from the displacement magnifying part is higher than the resonance frequency derived mainly from the piezoelectric element adhering part, the displacement is magnified and hence it is stable and the frequency region in which the time difference between the applied alternating-current signal and displacement magnifying part front end is constant may be further kept wider.

The unimorph type actuator utilizing ordinary resonance has the displacement changed very much by the driving frequency. For the purpose of stabilizing it, when driven at a frequency about 5% remote from the resonance frequency, a high voltage was required to obtain a similar displacement. By contrast, in the piezoelectric actuator having the constitution of the embodiment, when the shim has a longitudinal dimension of about 16 mm, the resonance frequency f2 derived from the displacement magnifying part is about 100 Hz, the resonance frequency f1 derived from the piezoelectric element adhering part is about 85 Hz, and an AC voltage of ±30 V is applied by driving between f1 and f2, a displacement of about 1.1 ±0.05 mm can be obtained in a section of about 6 Hz at the front end of the displacement magnifying part. A similar effect is obtained when the longitudinal dimension of the piezoelectric element adhering part is less than 18 mm and f2 is less than 120 Hz in the constitution of the piezoelectric actuator depending on the longitudinal dimension of the displacement magnifying part, and the difference of f2 and f1 is nearly in a range of 5 to 25% of f2. A similar effect may be also obtained when the difference of f1 and f2 is within 5%, but in this case the driving frequency region is smaller.

As for the driving voltage waveform, when it is closer to the rectangular waveform rather than the sinusoidal waveform, the displacement is larger at a same voltage.

Figure 16:
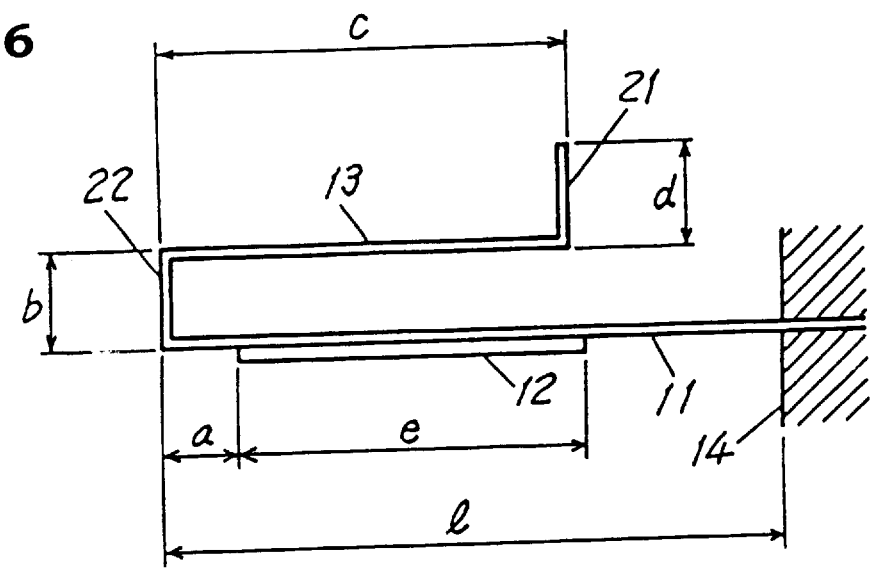
FIG. 16 is a schematic diagram showing a specific structural example of the piezoelectric actuator in the first embodiment of the invention.

FIG. 16 is a schematic diagram showing an example of practical shape of the piezoelectric actuator.

In FIG. 16, reference numeral 11 is a shim, 12 is a piezoelectric element, 13 is a displacement magnifying part, 14 is sensor base, 21 is a bending part, and 22 is a binding part.

In the diagram, symbols a, b, c, d, e, λ denote the dimensions of parts of the piezoelectric actuator, that is, (a) is the distance from the binding part 22 to the piezoelectric element 12, (b) is the distance between the piezoelectric element adhering part and the displacement magnifying part 13 positioned parallel to each other, (c) is the longitudinal dimension of the displacement magnifying part 13, (d) is the length of bending part 21, (e) is the longitudinal dimension of the piezoelectric element 12, and (λ) is the distance from the fixed part of the piezoelectric actuator to the binding part b of the front end.

The piezoelectric actuator changes in its resonance frequency depending on the material of the constituent members and dimensions of parts and others, and the driving characteristic varies every time. It is hence important to determine the conditions adequately for obtaining the intended characteristics. When the piezoelectric actuator is used as the chopper of the pyroelectric type infrared ray sensor, at high driving frequency, the sensitivity is lowered as the sensor. When using at low driving frequency, the resonance frequency of the piezoelectric actuator must be lowered, and in this case it is susceptible to effects of external disturbance due to lack of rigidity, and it is likely to be broken by impact. It is hence necessary to obtain displacement more than specified amount within a specific range of resonance frequency.

When phosphor bronze or ferriferous alloy is used as the material for the shim 11, displacement magnifying part 13, and binding part 22, by adjusting (a) from 0 mm to 2.5 mm, (b) from 1.2 mm to 3 mm, (c) from 11 mm to 15 mm, (d) from 3.5 mm to 6 mm, (e) from 9 mm to 14 mm, thickness t of shim 11 and others from 0.03 to 0.08, thickness p of piezoelectric element 12 from 0.05 to 0.12, and (λ) from 14 mm to 18 mm, a displacement of 1.0 mm can be obtained within the driving voltage of ±30 V, at driving frequency of nearly 60 Hz to 140 Hz. From the viewpoint of size of the piezoelectric actuator itself and displacement amount, in particular, when used as the chopper for pyroelectric type infrared ray sensor, it is optimized in the above conditions, and a pyroelectric type infrared sensor of smaller size and higher sensitivity can be realized. As a more practical example, using 32Ni-5Co-Fe with 't' of 0.05 mm and width 'w' of 1.0 to 2.2 mm as the material for the shim 11, etc., when (a) is defined from 0 to 2 mm, (b) from 1.8 mm to 2.8 mm, (c) from 12.5 mm to 14 mm, (d) from 3.8 mm to 4.8 mm, (e) from 10 mm to 13 mm, (p) from 0.05 to 0.12, and (λ) from 14.5 mm to 16.5 mm, a pyroelectric infrared ray sensor of nearly same characteristic as above is obtained at driving frequency nearly ranging from 70 Hz to 110 Hz. Generally, 32Ni-5Co-Fe is called Super Invar, and is known as a material of low thermal expansion rate. The piezoelectric element has a far lower thermal expansion rate than ordinary metals, and if this difference is large when adhering, warp is caused due to ambient temperature changes. Super Invar can suppress this phenomenon as much as possible, and therefore when used as the chopper for pyroelectric type infrared ray sensor, the temperature dependence of sensor output due to temperature dependence of chopper displacement position can be alleviated. In addition, Super Invar is relatively excellent in bending than other ferriferous materials, and is suited to forming of shim for the piezoelectric actuator as in this embodiment. Besides, when compared with other material as the structural material for the piezoelectric actuator seen in this embodiment, Super Invar is known to have an intermediate property between the copper material and general iron material such as stainless steel, that is, it has an intermediate resonance frequency of the two materials. Still more, Super Invar is softer than other general iron materials, and is hence easier to obtain displacement, and also it has a stronger rigidity than copper materials and is strong against disturbance, and therefore it is ideal as the constituent material of the chopper for pyroelectric type infrared ray sensor.

Figure 17:
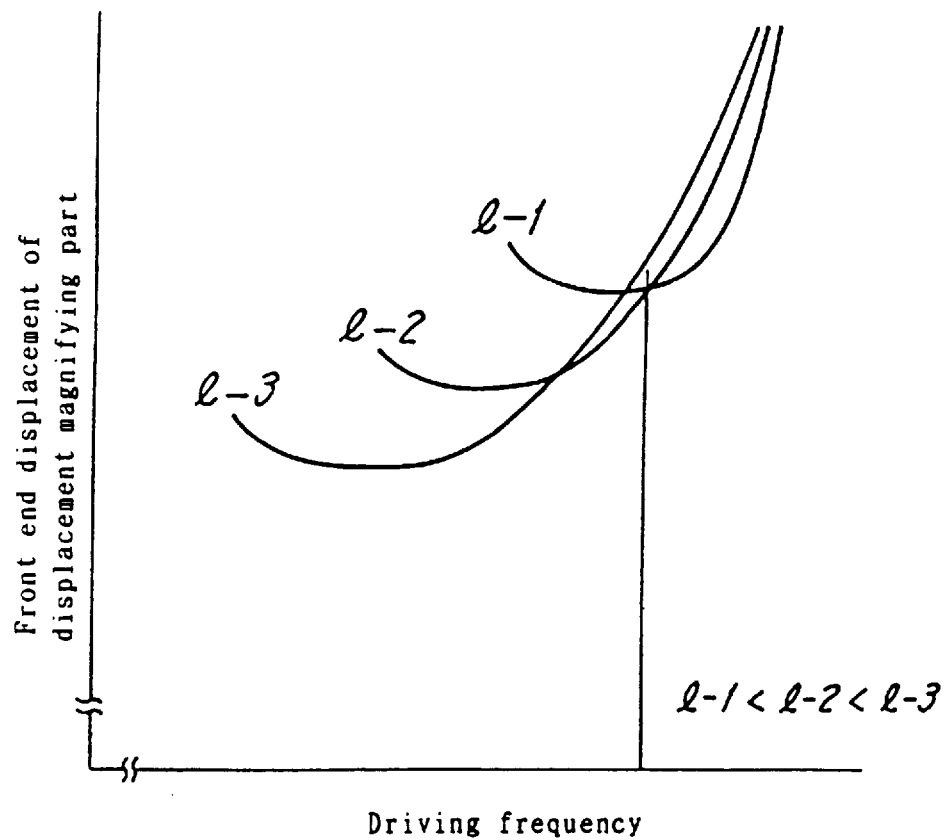
FIG. 17 is a displacement characteristic diagram of the same piezoelectric actuator, FIG. 18 (a) is a schematic diagram showing other specific structural example of the piezoelectric actuator in the first embodiment of the invention, FIG. 18 (b) is a displacement characteristic diagram of the same piezoelectric actuator.

FIG. 17 is a characteristic diagram showing an example of relation of displacement amount of displacement magnifying part front end and driving frequency, when the length from the fixed end of the piezoelectric actuator to the binding part front end is varied in the piezoelectric actuator in the embodiment.

In FIG. 17, λ-1, λ-2, λ-3 are respectively specific lengths from the fixed end of piezoelectric actuator to the binding part front end, and λ-3 is longest followed by λ-2 and λ1 sequentially. At each length, as the relation between displacement and driving frequency, the displacement shows the lowest value at a specific driving frequency, and the displacement increases toward the higher driving frequency or lower driving frequency. That is, the lower driving frequency side is closer to the resonance frequency f1 derived from the vibration of the piezoelectric element adhering part, whereas the driving frequency at the higher side approaches the resonance frequency f2 derived from vibration of the displacement magnifying part. The displacement amounts at both resonances are not identical, and the f2 side displacement is larger. When the length of the piezoelectric actuator is changed from λ-1 to λ-2 and λ-3, f1 gradually moves to a smaller value, but f2 is smaller in moving extent than f1. Accordingly, the displacement amount of the stable region decreases due to the effect of both resonances going remote, but the value of f2 and displacement amount of its vicinity are smaller in the decreasing width. Therefore, the driving frequencies of mutually intersecting characteristics of λ-1, λ-2, λ-3 are very close to each other, and the displacement amounts are also close values. That is, when the piezoelectric actuator is driven at this driving frequency, newly same displacement amounts are obtained if the mounting error is within λ-1 to λ-3. In other words, a piezoelectric actuator having a longer shape, relatively to the displacement amount of the stable region at a certain length, induces a nearly same displacement. In this case, driving is driving in stable region of the piezoelectric actuator, and at a higher frequency than in the stable region. Herein, as the dimension shorter than λ-1, although it is possible to drive at a lower frequency than the driving frequency wherein the displacement is minimum in the stable region, but in this case, the resonance derived from the piezoelectric element adhering part becomes dominant, and the distortion of the adhesion layer of the shim and piezoelectric element or piezoelectric element itself increases, which is not preferable for the reliability. To the contrary, by bringing closer by resonance of the displacement magnifying part, the above effect is alleviated, and therefore the reliability tends to depend more on the strength of the elastic metal element. As a result, while keeping the strength of the displacement magnifying part against displacement, by driving near the stable region of displacement and at higher frequency, a higher reliability and driving at stable displacement are obtained. More specifically, in the above piezoelectric actuator using Super Invar, at (λ) of 16 mm and driving frequency of 85 Hz, when a displacement of 1.2 mm is obtained, if (λ) becomes 16.5 mm, a displacement of about 1.1 mm can be maintained. Therefore, by employing this constitution and driving method, mounting of piezoelectric actuator is easy, and a stable characteristic is obtained, and further reliability is enhanced. However, (λ) reaches the maximum at a certain value, and it must be noted that the displacement tends to decrease when becoming shorter.

It is easily supposed that a similar tendency is noted not only the piezoelectric actuator in the shape of the embodiment, but also in the piezoelectric actuator having similar constitution and driving method.

Figure 18A:
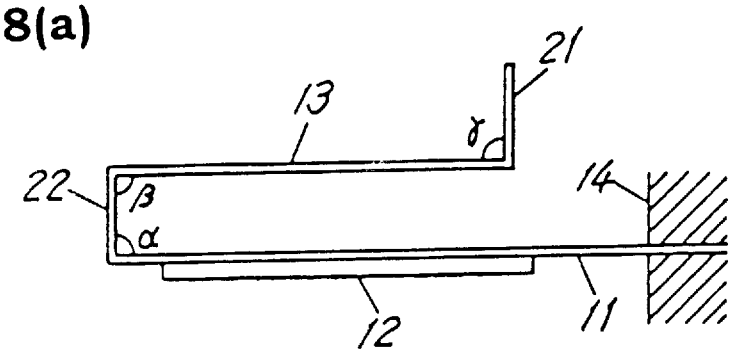
Figure 18B:
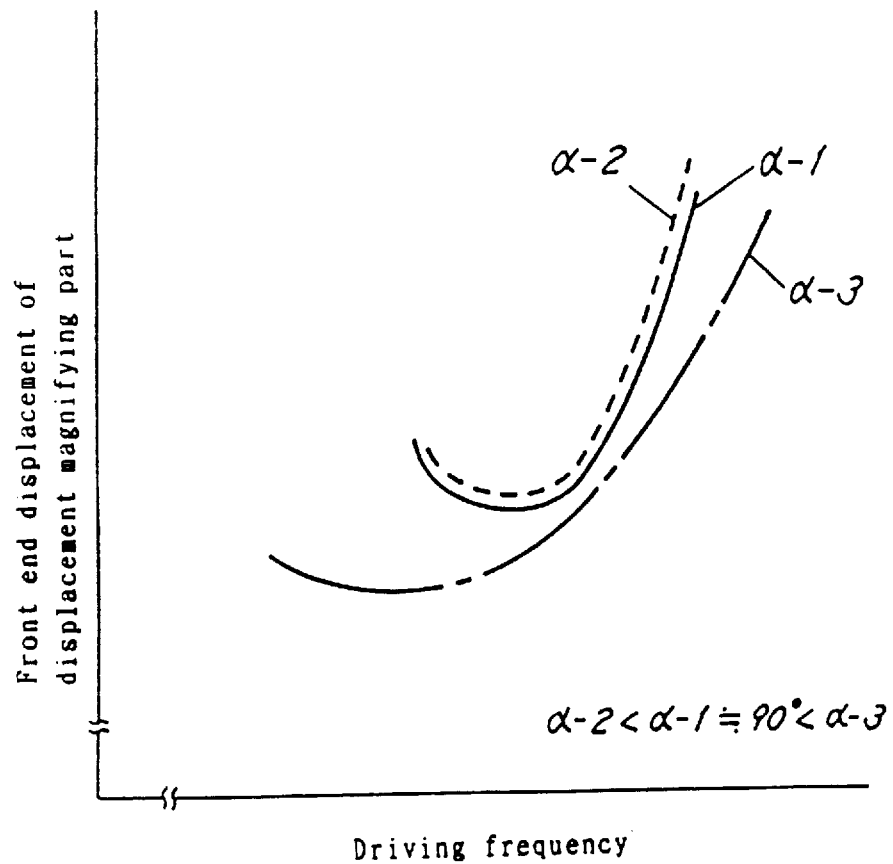

FIG. 18 (a) and FIG. 18 (b) are schematic and characteristic diagrams showing an example of relation of displacement amount of displacement magnifying part front end and driving frequency in the case of change of bending angle in part of the same piezoelectric actuator in the piezoelectric actuator in the embodiment.

In FIG. 18 (a), reference numeral 11 is a shim, 12 is a piezoelectric element, 13 is a displacement magnifying part, 14 is a sensor base, 21 is a bending part, and 22 is a binding pat.

The constitution of the piezoelectric actuator in FIG. 18 (a) is similar to the above constitution by bending of the elastic metal element, and the angle formed by the shim 11 and binding part 22 is supposed to be α the angle formed by the binding part 22 and displacement magnifying part 13 to be α, and the angle formed by the displacement magnifying part 13 and bending part 21 to be γ. The angles α,β,γ are nearly 90 degrees each in this embodiment, and this value is intentionally set at various angles depending on the bending error when processing or the structural purpose when combining with sensor or the like to form a unit. These angle changes induce various characteristic changes in the piezoelectric actuator having identical dimensions and shapes, and this point must be taken into consideration when setting the angle arbitrarily. For example, regarding α, the characteristic changes as shown in FIG. 18 (b).

In FIG. 18 (b), α-1, α-2, α-3 respectively show values of a certain a, supposing α-1 to be 90 degrees, α-2 to be smaller than 90 degrees and α-3 to be larger than 90 degrees. At this time, the shim 11 and displacement magnifying part 13 are always parallel to each other, and all dimensions of constituent members other than the length from the fixing part to the front end, angle of displacement magnifying part 13 and bending part 21, binding part 22, and piezoelectric element 12 are supposed to be identical. FIG. 18 (b) show the relation between the displacement of displacement magnifying part front end and driving frequency at each α in this case. Each displacement has a stable region same as mentioned above, and as the driving frequency becomes remoter therefrom, the displacement is extended to both resonance points. Comparing each displacement, the value of α having the largest displacement is α-1, and the difference of α-1 and α-3 is greater than the difference of α-1 and α-2, that is, as compared with a of larger than 90 degrees, the decrease of displacement characteristic is smaller at a of 90 degrees or less, and as compared with the design value of 90 degrees, when the mounting error is set in a direction smaller than 90 degrees, the characteristic fluctuations among individual pieces can be alleviated. As a practical example, in the piezoelectric actuator composed by using Super Invar of the embodiment, while the displacement was 1.1 mm at a of 90 degrees, it was about 1.05 mm at 80 degrees, and about 0.95 mm at 100 degrees.

Similarly, regarding β, as compared with the resonance frequency at β of 90 degrees, the smallest value of fluctuation width of resonance frequency against fluctuations of β is near 90 degrees, and the variation width of resonance frequency is smaller at β of more than 90 degrees than over 90 degrees. Hence, by forming an obtuse angle between the displacement magnifying part and binding part, fluctuations of resonance frequency can be suppressed, and the characteristics among individual pieces can be stabilized. In addition, by forming an obtuse angle between the displacement magnifying part and binding part, the relative distance of the displacement magnifying part front end and shim is increased, and contact of the two can be avoided, so that a greater displacement amount can be obtained.

Herein, the resonance of the piezoelectric actuator of this embodiment is resonance due to vibration of displacement magnifying part and resonance due to the piezoelectric element adhering part, but the both vibrations are not completely independent of each other while driving, and if one is vibrating largely, the other may be vibrating slightly, and therefore the displacement amount obtained in the displacement magnifying part is a combination of these vibrations. Moreover, from a wider point of view, depending on the structure, there may be various other cases, a case of excitation of other resonance than the above two, a case of inducing resonance in the bending part at the front end of the displacement magnifying part, and a case of excitation of resonance not used in driving near the driving frequency, among others. If, however, the distance is sufficiently remote from the actual frequency, or unnecessary resonance takes place within the operating frequency, there is no problem as far as the scale is small, and same driving as in this embodiment is realized.

Thus, by the piezoelectric actuator having such constitution of the embodiment, driving by making use of resonance can be done stably at a lower voltage, and driving, assembling and processing of members will be easy. Besides, by the bent structure, the entire longitudinal dimension is shortened, and when the piezoelectric actuator of this constitution is used as the chopper for the pyroelectric type infrared ray sensor, the entire sensor can be reduced in size. Moreover, by fixing the piezoelectric actuator on the same base as the infrared ray detecting unit, it can be easily integrated with the infrared ray detecting unit, and in addition the vicinity of the infrared ray detecting unit can be opened and closed, and hence the opening and closing area is reduced, and the load of the chopper may be lessened. Still more, by driving at low voltage, effects of noise from the piezoelectric element on the infrared ray detecting unit can be decreased.

The piezoelectric actuator of the embodiment, as compared with the conventional resonance method, is stabler in vibration near the resonance frequency, and can be driven at lower voltage, so that various fluctuations in the manufacturing process, if any, can be absorbed.

In the embodiment, incidentally, the piezoelectric element adhering part is a unimorph type element adhering the piezoelectric element only on one side of the shim, but same effects are obtained, needless to say, by using the bimorph type element adhering on both sides. Depending on the constitution, moreover, the shim and piezoelectric element may be fixed at the same time. If the piezoelectric element is adhered only to one opposite side of adhering the piezoelectric element in the embodiment, of course, same effects are obtained.

(Embodiment 2)

Figure 4:
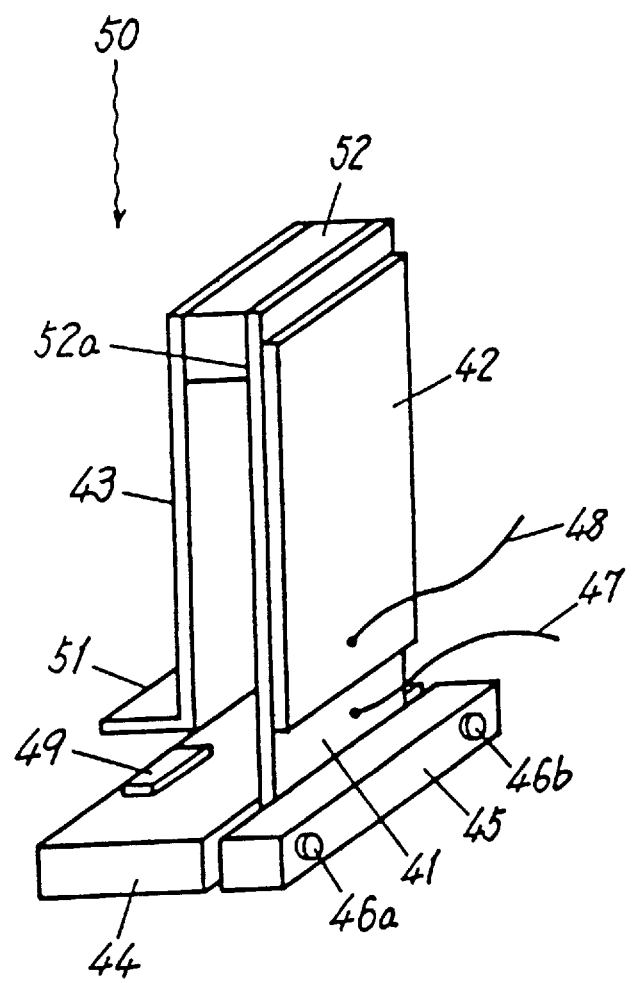
FIG. 4 is a perspective view showing a constitution of a piezoelectric actuator in a second embodiment of the invention.

FIG. 4 is a perspective view showing an example of chopper for pyroelectric type infrared ray type sensor using a unimorph type piezoelectric actuator in a second embodiment of the invention.

In FIG. 4, reference numeral 41 is a shim, 42 is a piezoelectric element, 43 is a displacement magnifying part, 44 is a sensor base, 45 is a fixing piece, 46a, 46b are fixing screws, 47 is a wiring for shim, 48 is a wiring for piezoelectric element, 49 is an infrared ray detecting unit, 50 is an infrared ray, 51 is a bending part, and 52 is a binding member. The shim 41 and displacement magnifying part 43 are made of separate members of elastic flat plate, and are bound together at one end of the both respectively through the binding member 52. The shim 41 and displacement magnifying part 43 are composed to be parallel to each other from the binding part and have a longitudinal dimension in the same direction.

The other constitution is same as in embodiment 1 shown in FIG. 1, and its effects are also same as in embodiment 1. In addition, by forming the shim 41 and displacement magnifying part 43 by separate members and binding them through a binding member, the material and dimension of the shim and displacement magnifying part may be selected arbitrarily, and hence it is possible to design with a wider degree of freedom from the aspects of setting of resonance frequency, displacement and strength. In assembling, moreover, the piezoelectric element can be adhered easily, and stress concentration in the binding part can be alleviated as compared with forming by bending. Still more, the resonance frequency f1 due to piezoelectric element adhering part can be lowered by the weight of the binding member, and it can be easily set at a lower value than the resonance frequency f2 due to the displacement magnifying part, which contributes to reduction of longitudinal dimension and stable driving.

At this time, by composing the binding member by positioning a part 52a in the adhering range of the piezoelectric element along the longitudinal direction of the piezoelectric element adhered to the piezoelectric element adhering part, stress to the adhesion layer between the piezoelectric element and shim can be alleviated, as compared with positioning outside the piezoelectric element adhering range of the piezoelectric element adhering part front end, so that peeling of the piezoelectric element may be prevented.

(Embodiment 3)

Figure 5:
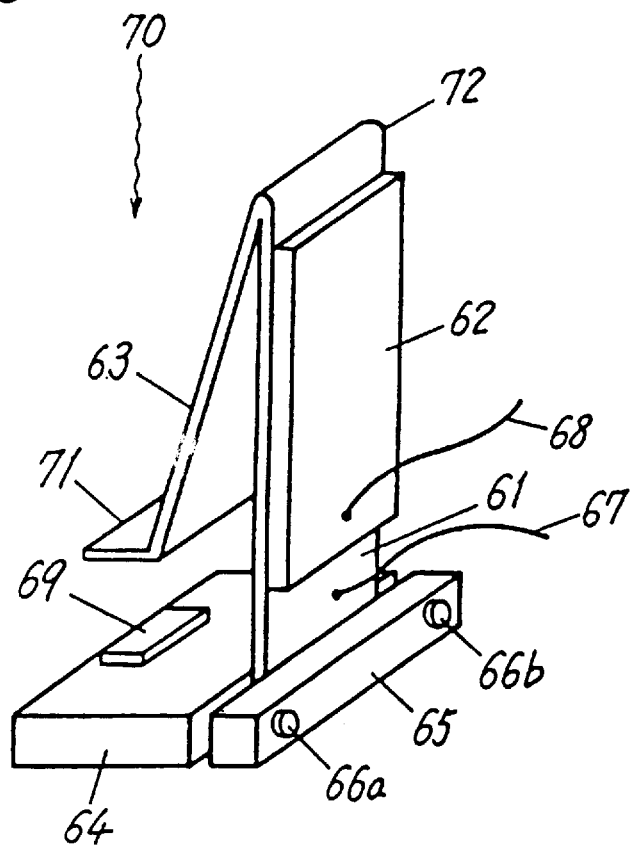
FIG. 5 is a perspective view showing a constitution of a piezoelectric actuator in a third embodiment of the invention.

FIG. 5 is a perspective view showing an example of chopper for pyroelectric type infrared ray type sensor using a unimorph type piezoelectric actuator in a third embodiment of the invention.

In FIG. 5, reference numeral 61 is a shim, 62 is a piezoelectric element, 63 is a displacement magnifying part, 64 is a sensor base, 65 is a fixing piece, 66a, 66b are fixing screws, 67 is a wiring for shim, 68 is a wiring for piezoelectric element, 69 is an infrared ray detecting unit, 70 is an infrared ray, and 71 is a bending part for interrupting the infrared ray. The shim 61 and displacement magnifying part 63 are integrally composed of a same elastic flat plate, and an acute angle 72 is formed between them by bending.

The other constitution is the same as in embodiment 1 shown in FIG. 1, and its effects are also same as in embodiment 1. In addition, since an acute angle is formed between the shim and displacement magnifying part, it is possible to be composed by a smaller number of parts and processes, and the acute-angle bent part 72 is remote from the incident path of infrared ray, and the problem of interference of incidence of infrared ray into the infrared ray detecting unit by the motion of the piezoelectric element binding part can be avoided. Besides, in the displacement magnifying part of the same shape, the resonance frequency f1 due to vibration of the piezoelectric element adhering part can be particularly varied by the angle. When the angle is large, the resonance frequency due to vibration of the piezoelectric element adhering part is lowered. When driving at high frequency, the angle is preferred to be smaller, and when driving at 50 Hz or higher, it is preferred to bent to an acute angle of 45 degrees or less, and hence the effect is remarkable in this case.

(Embodiment 4)

Figure 6:
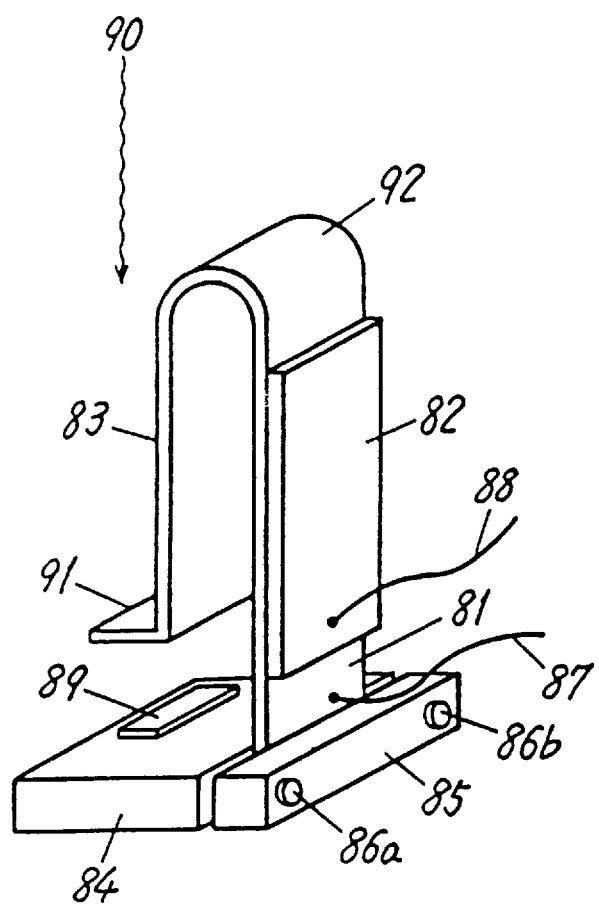
FIG. 6 is a perspective view showing a constitution of a piezoelectric actuator in a fourth embodiment of the invention.

FIG. 6 is a perspective view showing an example of chopper for pyroelectric type infrared ray type sensor using a unimorph type piezoelectric actuator in a fourth embodiment of the invention.

In FIG. 6, reference numeral 81 is a shim, 82 is a piezoelectric element, 83 is a displacement magnifying part, 84 is a sensor base, 85 is a fixing piece, 86a, 86b are fixing screws, 87 is a wiring for shim, 88 is a wiring for piezoelectric element, 89 is an infrared ray detecting unit, 90 is an infrared ray, and 91 is a bending part. The shim 81 and displacement magnifying part 83 are integrally composed of a same elastic flat plate, and a binding part 92 between them has a radius of curvature of ¼ or more of the distance for opening and closing as chopper.

The other constitution is the same as in embodiment 1 shown in FIG. 1, and its effects are also the same as in embodiment 1. In addition, as the binding part 92 of the shim and displacement magnifying part has a proper curvature, stress concentration in the binding part is alleviated, and the mechanical reliability is enhanced. Besides, by defining the radius of curvature at least ¼ or more of the opening and closing distance of the chopper, collision of the two during driving can be avoided when the shim and displacement magnifying part are composed parallel to each other. This constitution is shared with the above case of forming the shim and displacement magnifying part integrally and forming an acute angle.

(Embodiment 5)

Figure 7:
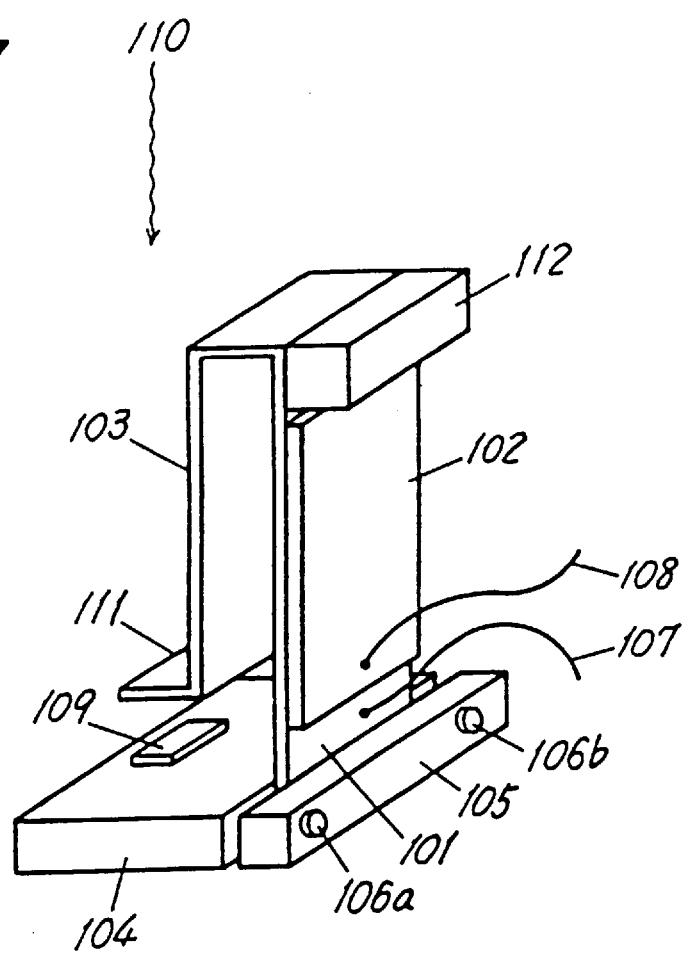
FIG. 7 is a perspective view showing a constitution of a piezoelectric actuator in a fifth embodiment of the invention.

FIG. 7 is a perspective view showing an example of chopper for pyroelectric type infrared ray type sensor using a unimorph type piezoelectric actuator in a fifth embodiment of the invention.

In FIG. 7, reference numeral 101 is a shim, 102 is a piezoelectric element, 103 is a displacement magnifying part, 104 is a sensor base, 105 is a fixing piece, 106a, 106b are fixing screws, 107 is a wiring for shim, 108 is a wiring for piezoelectric element, 109 is an infrared ray detecting unit, 110 is an infrared ray, 111 is a bending part, and 112 is a weight. The shim 101 and displacement magnifying part 103 are integrally formed, and it is designed to have a longitudinal dimension in a same direction, parallel to each other from the binding part to the shim 101 to the displacement magnifying part 103. Besides, the weight 112 is provided on the opposite side confronting the displacement magnifying part 103 near the binding part of the shim 101.

The other constitution is same as in embodiment 1 shown in FIG. 1, and its effects are also same as in embodiment 1. In addition, by disposing the weight near the front end of the movable part of the piezoelectric element adhering part, the resonance frequency f1 due to vibration of the piezoelectric element adhering part is mainly lowered, and it can be set easily at a lower resonance frequency than the resonance frequency f2 due to vibration of the displacement magnifying part, so that stable driving is easily achieved. Besides, by lowering the resonance frequency by disposing the weight, the entire shape can be reduced in size as compared with the case of adjusting the resonance frequency in the longitudinal dimension without using weight.

The weight placing position may not be always near the front end, but in the same weight, the effect on the resonance frequency is greater when placed near the front end. In the embodiment, the weight is placed on the same surface as the piezoelectric element adhering part, but the same effect is obtained if placed on the reverse side. In this case, when the weight is placed so as to be positioned partly or entirely within the range of the piezoelectric element adhesion along the longitudinal direction of the piezoelectric element, stress loading on the adhesion layer of the shim and piezoelectric element due to placing of the weight can be alleviated, and peeling of the piezoelectric element can be prevented.

(Embodiment 6)

Figure 8:
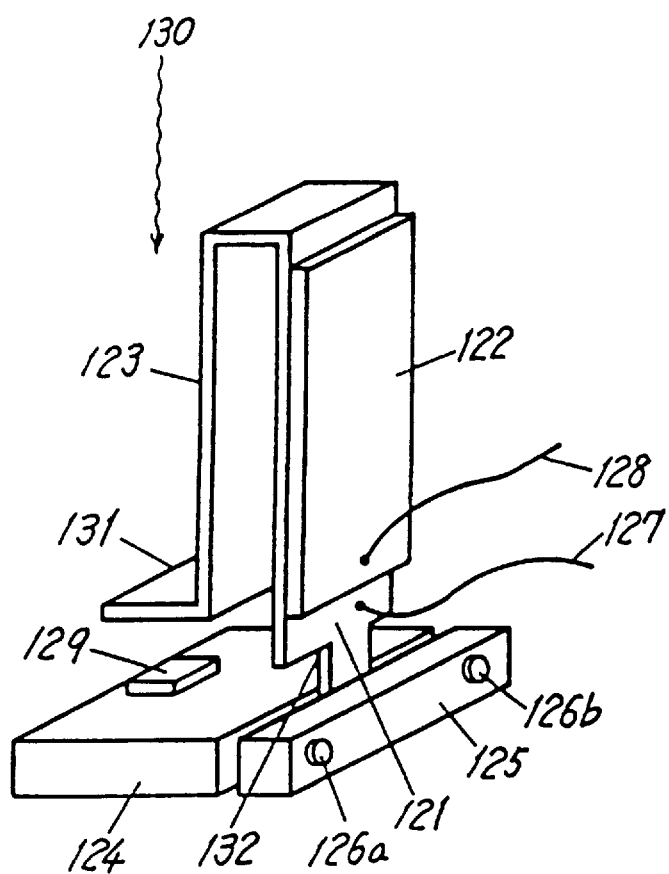
FIG. 8 is a perspective view showing a constitution of a piezoelectric actuator in a sixth embodiment of the invention.

FIG. 8 is a perspective view showing an example of chopper for pyroelectric type infrared ray type sensor using a unimorph type piezoelectric actuator in a sixth embodiment of the invention.

In FIG. 8, reference numeral 121 is a shim, 122 is a piezoelectric element, 123 is a displacement magnifying part, 124 is a sensor base, 125 is a fixing piece, 126a, 126b are fixing screws, 127 is a wiring for shim, 128 is a wiring for piezoelectric element, 127 is an infrared ray detecting unit, 130 is an infrared ray, 131 is a bending part, and 132 is a notch. By bending an elastic flat late in a pi-shape, the shim 121 and displacement magnifying part 123 are formed integrally, and it is designed to have a longitudinal dimension in same direction, parallel to each other from the binding part to the shim 121 and displacement magnifying part 123. At other end of the shim 121, moreover, the notch 132 is formed in the portion held between the sensor base 124 and fixing piece 125, so that the width is narrowed.

The other constitution is same as in embodiment 1 shown in FIG. 1, and its effects are also same as in embodiment 1. In addition, by forming a notch in the width direction, in the fixing part of the piezoelectric element adhering part or near the fixing part in the movable part of the piezoelectric element adhering part, the resonance frequency f1 due to vibration of the piezoelectric element adhering part is mainly lowered, and it can be set easily at a lower resonance frequency than the resonance frequency f2 due to vibration of the displacement magnifying part, so that stable driving is easily achieved, which also contributes to reduction of the longitudinal dimension.

(Embodiment 7)

Figure 9:
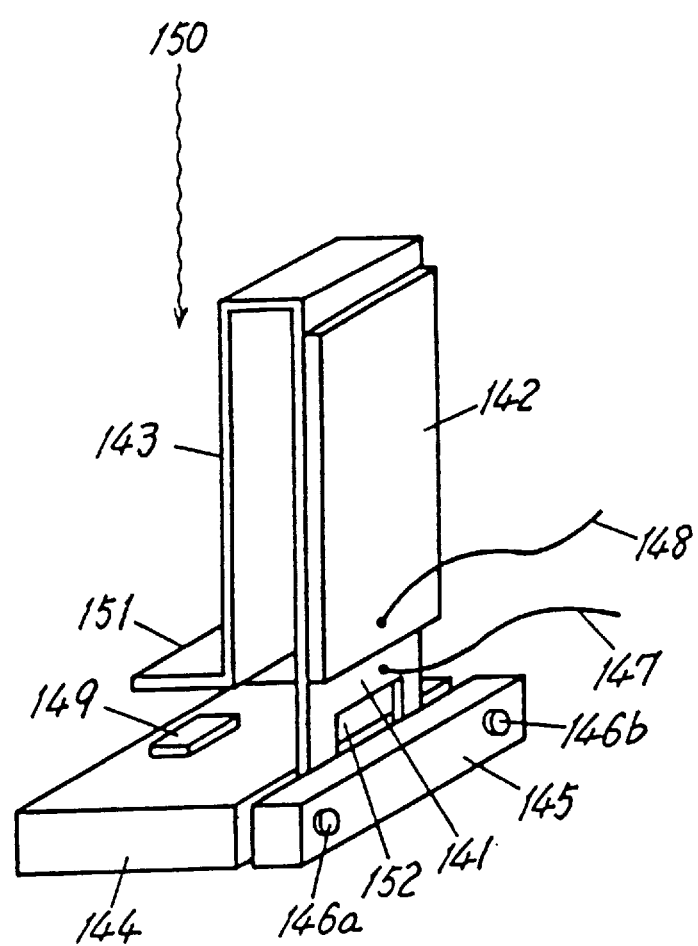
FIG. 9 is a perspective view showing a constitution of a piezoelectric actuator in a seventh embodiment of the invention.

FIG. 9 is a perspective view showing an example of chopper for pyroelectric type infrared ray type sensor using a unimorph type piezoelectric actuator in a seventh embodiment of the invention.

In FIG. 9, reference numeral 141 is a shim, 142 is a piezoelectric element, 143 is a displacement magnifying part, 144 is a sensor base, 145 is a fixing piece, 146a, 146b are fixing screws, 147 is a wiring for shim, 148 is a wiring for piezoelectric element, 149 is an infrared ray detecting unit, 150 is an infrared ray, 151 is a bending part, and 152 is a hole processing part. By bending an elastic flat plate in a pi-shape, the shim 141 and displacement magnifying part 143 are formed integrally, and it is designed to have a longitudinal dimension in same direction, parallel to each other from the binding part to the shim 141 and displacement magnifying part 143. At other end of the shim 141, moreover, the hole processing part 152 is formed in the portion held between the sensor base 144 and fixing piece 145.

The other constitution is same as in embodiment 1 shown in FIG. 1, and its effects are also same as in embodiment 1. In addition, by forming a hole processing part in the fixing part of the piezoelectric element adhering part or near the fixing part in the movable part of the piezoelectric element adhering part, the resonance frequency f1 due to vibration of the piezoelectric element adhering part is mainly lowered, and it can be set easily at a lower resonance frequency than the resonance frequency f2 due to vibration of the displacement magnifying part, so that stable driving is easily achieved, which also contributes to reduction of the longitudinal dimension.

Besides, as compared with the shape reduced in the dimension in the width direction by the notch or the like, it is stable against torsional stress, and resistant to generation of rotary vibration mode on the longitudinal axis, and is hence enhanced in the mechanical reliability. Incidentally, similar hole processing or notch mentioned in embodiment 7 may be also provided in the displacement magnifying part, and in this case it is the means of obtaining specified resonance frequency easily against increase of resonance frequency in the case of reducing the size of the piezoelectric element adhering part and the movable part.

(Embodiment 8)

Figure 10:
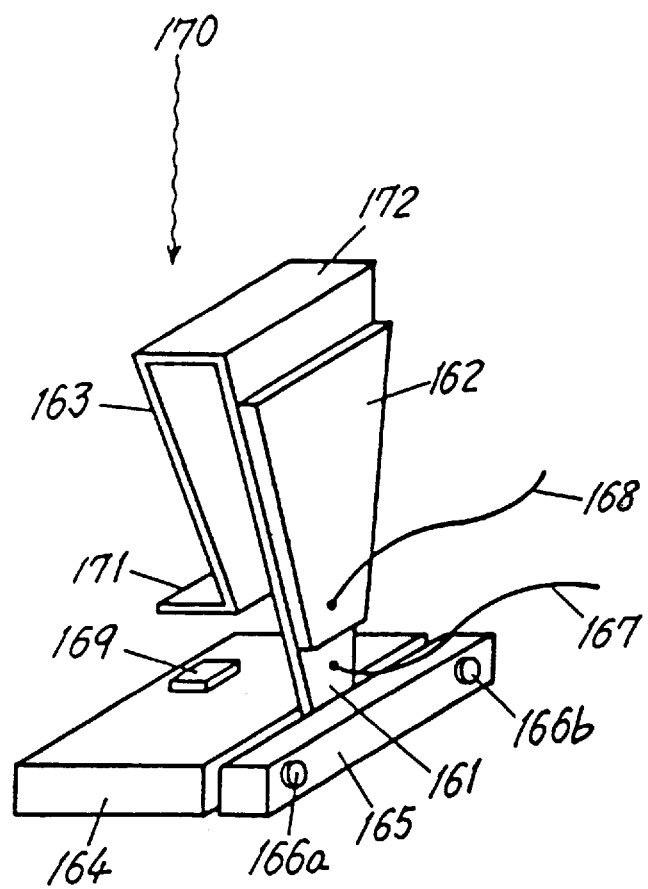
FIG. 10 is a perspective view showing a constitution of a piezoelectric actuator in an eighth embodiment of the invention.

FIG. 10 is a perspective view showing an example of chopper for pyroelectric type infrared ray type sensor using a unimorph type piezoelectric actuator in an eighth embodiment of the invention.

In FIG. 10, reference numeral 161 is a shim, 162 is a piezoelectric element, 163 is a displacement magnifying part, 164 is a sensor base, 165 is a fixing piece, 166a, 166b are fixing screws, 167 is a wiring for shim, 168 is a wiring for piezoelectric element, 169 is an infrared ray detecting unit, 170 is an infrared ray, and 171 is a bending part. By bending an elastic flat plate in a pi-shape, the shim 161 and displacement magnifying part 163 are formed integrally, and it is designed to have a longitudinal dimension in same direction, from the binding part 172 to the shim 161 and displacement magnifying part 163. The width of the shim 161 becomes narrower from the binding part 172 to the fixed end. Similarly, the width of the displacement magnifying part 163 becomes narrower from the binding part 172 to the other end. On the surface of the shim 161, the piezoelectric element 162 having a shape conforming to the contour of the shim 161 is adhered.

The other constitution is same as in embodiment 1 shown in FIG. 1, and its effects are also same as in embodiment 1. In addition, by narrowing the outer dimension of the movable part of the piezoelectric element adhering part from the binding part of the displacement magnifying part to the fixing part, the resonance frequency f1 due to vibration of the piezoelectric element adhering part is lower than when the outer dimension is a specific width. To the contrary, in the displacement magnifying part, by narrowing the outer dimension from the binding part to the other end, the resonance frequency f2 due to vibration of the displacement magnifying part is higher than when the outer dimension is a specific width. Therefore, the resonance frequency f2 due to displacement magnifying part can be easily set higher than the resonance frequency f1 due to vibration of the piezoelectric element adhering part, thereby stabilizing the driving and reducing the longitudinal dimension as compared with the case without change in outer dimension. In this embodiment, the outer dimension is changed in both piezoelectric element adhering part and displacement magnifying part, but same effects are obtained by changing only in one of them.

(Embodiment 9)

Figure 11:
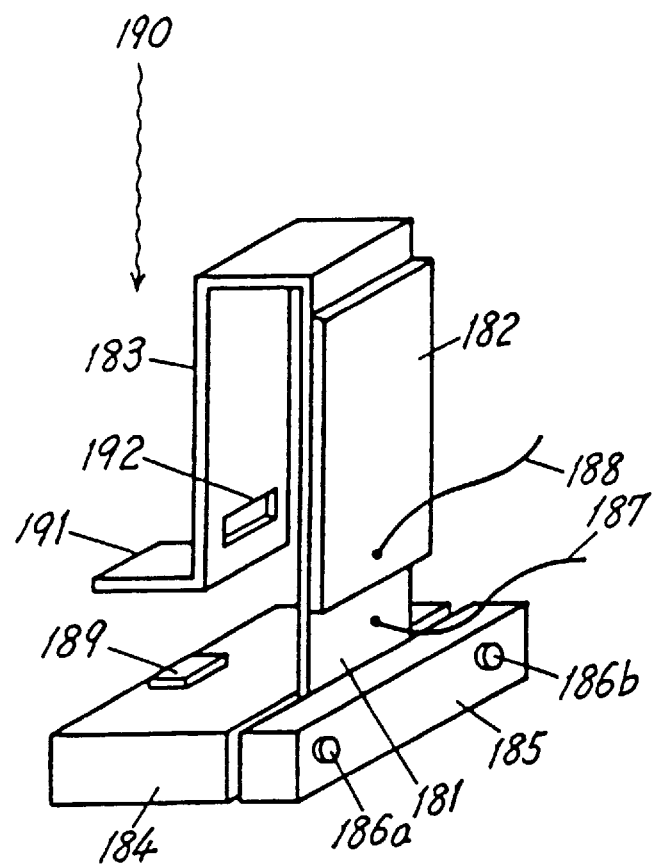
FIG. 11 is a perspective view showing a constitution of a piezoelectric actuator in a ninth embodiment of the invention.

FIG. 11 is a perspective view showing an example of chopper for pyroelectric type infrared ray type sensor using a unimorph type piezoelectric actuator in a ninth embodiment of the invention.

In FIG. 11, reference numeral 181 is a shim, 182 is a piezoelectric element, 183 is a displacement magnifying part, 184 is a sensor base, 185 is a fixing piece, 186a, 186b are fixing screws, 187 is a wiring for shim, 188 is a wiring for piezoelectric element, 189 is an infrared ray detecting unit, 190 is an infrared ray, and 191 is a bending part. By bending an elastic flat plate in a pi-shape, the shim 181 and displacement magnifying part 183 are formed integrally, and it is designed to have a longitudinal dimension in same direction, from the binding part to the shim 181 and displacement magnifying part 183. The displacement magnifying part 183 has a hole processing part 192 near one end at the opposite side of the binding part with the shim 181.

The other constitution is same as in embodiment 1 shown in FIG. 1, and its effects are also same as in embodiment 1. In addition, by forming a hole processing part near the bending part of the displacement magnifying part, the resonance frequency f2 due to vibration of the displacement magnifying part 183 becomes a higher value, and it can be easily set to a higher value than the resonance frequency f1 due to vibration of the piezoelectric element adhering part, thereby contributing to stabilization of displacement and reduction of the entire size as compared with the case of obtaining same resonance frequency without forming hole processing part. Although an effect is obtained if the hole processing part is not near the bending part, the effect is greater when the distance is remoter from the binding part with the piezoelectric element adhesion.

It is also possible to compose by combining the constitutions mentioned in embodiments 5 to 9, and greater effects will be obtained in the combined constitution.

(Embodiment 10)

Figure 12:
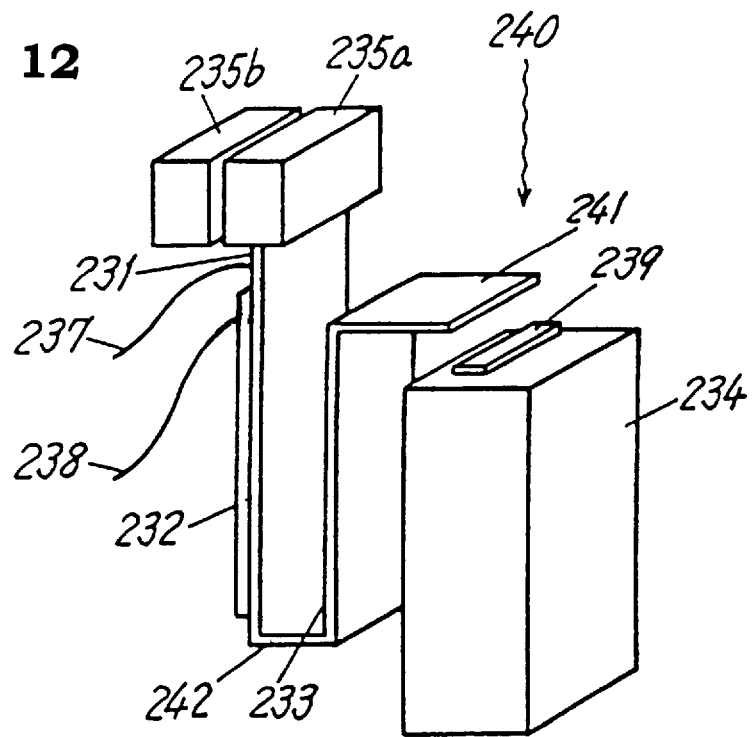
FIG. 12 is a perspective view showing a constitution of a piezoelectric actuator in a tenth embodiment of the invention.
Figure 13:
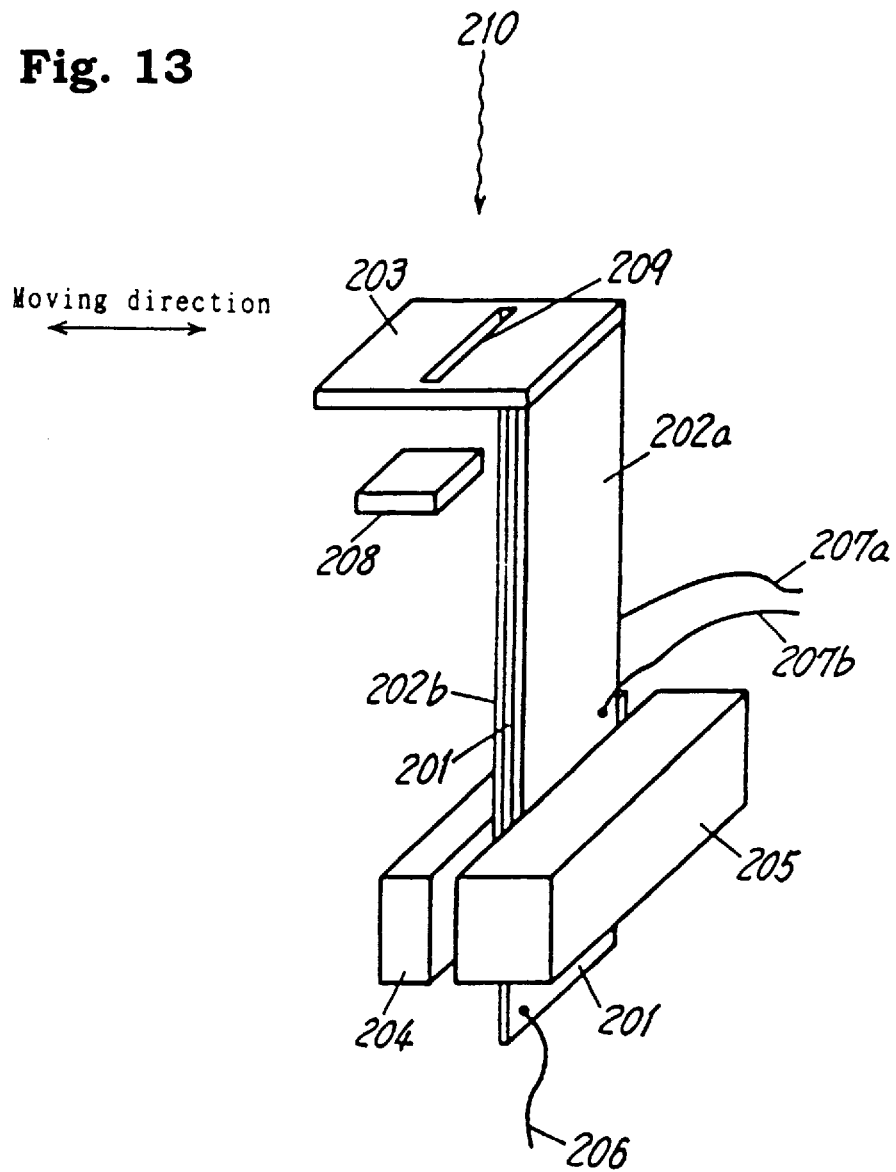
FIG. 13 is a perspective view showing a constitution of a conventional piezoelectric actuator.
Figure 14:
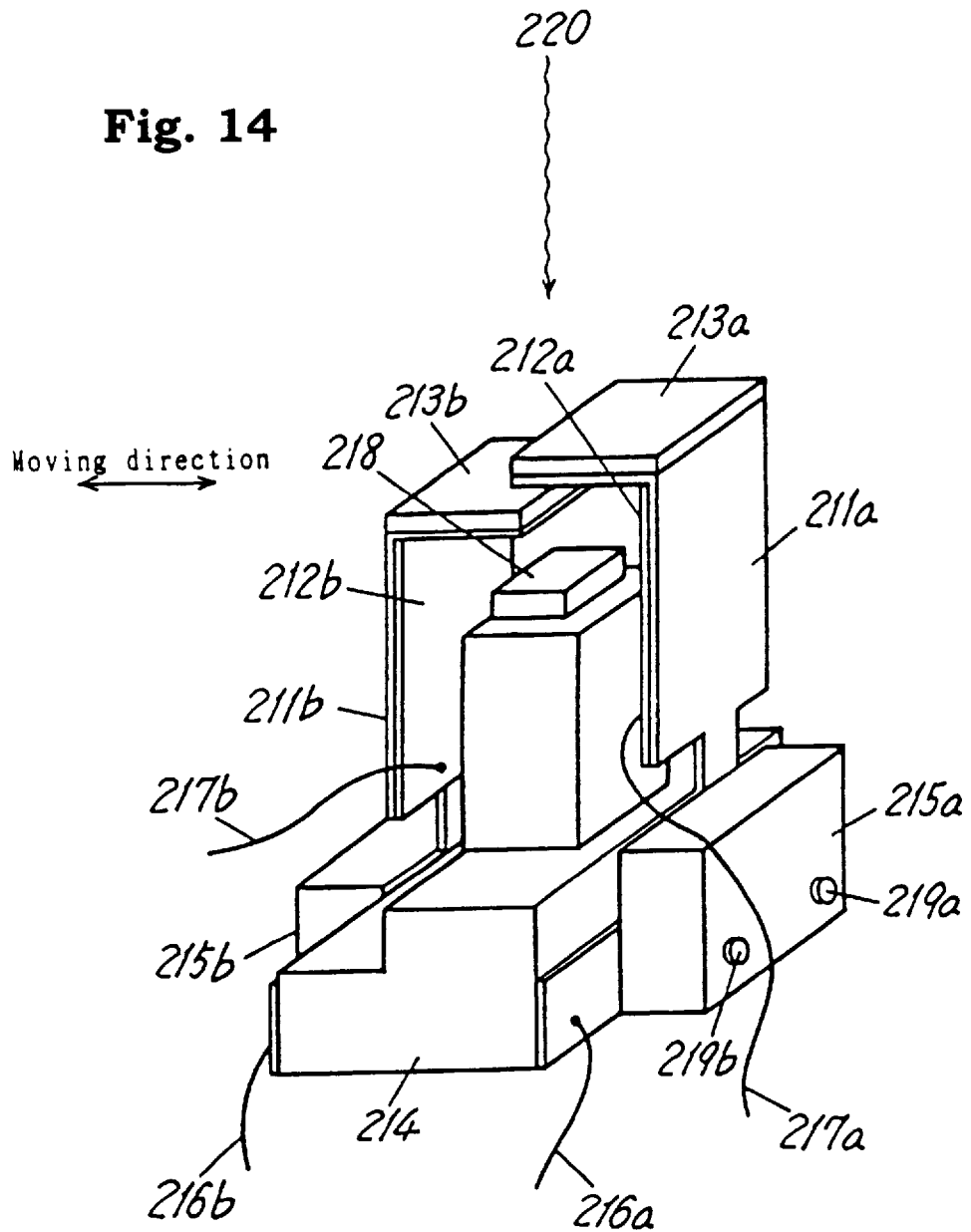
FIG. 14 is a perspective view showing other constitution of a conventional piezoelectric actuator.
Figure 15:
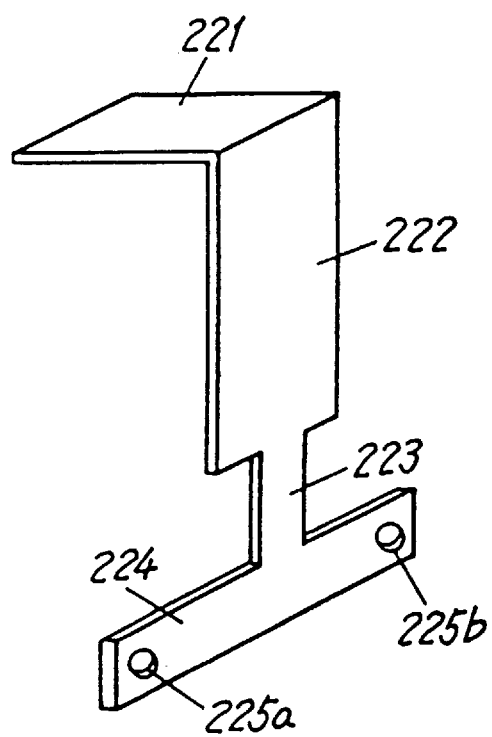
FIG. 15 is a perspective view showing a shim used in a conventional piezoelectric actuator.

FIG. 12 is a perspective view showing an example of chopper for pyroelectric type infrared ray type sensor using a unimorph type piezoelectric actuator in a tenth embodiment of the invention.

In FIG. 12, reference numeral 231 is a shim, 232 is a piezoelectric element, 233 is a displacement magnifying part, 234 is a sensor base, 235a, 235b are fixing pieces, 237 is a wiring for shim, 238 is a wiring for piezoelectric element, 239 is an infrared ray detecting unit, 240 is an infrared ray, and 241 is a bending part.

By bending an elastic flat plate of phosphor bronze, stainless steel alloy or the like in a pi-shape, the shim 231 and displacement magnifying part 233 are integrally formed, and it is designed to have a longitudinal dimension in same direction, parallel to each other from the binding part to the shim 231 and displacement magnifying part 233. Moreover, in the displacement magnifying part 233, the front end opposite to the binding part is formed at a right angle, and the bending part 241 is formed on the opposite side of the shim 231. The piezoelectric element 232 is adhered on the surface of the shim 231, and the piezoelectric element adhering part (unimorph type element) is formed. The shim 231 is fixed between the fixing pieces 235a and 235b, near the end portion of the opposite side of the binding part 242 with the displacement magnifying part 233. The sensor base 234 and fixing pieces 235a, 235b are fitted to the inside of a rigid box or the like covering the outer circumference of the sensor, the bending part 241 is located near the infrared ray detecting unit 239 disposed on the sensor base 234, and the displacement magnifying part 233 is extended in the longitudinal direction to the running direction side of the infrared ray 240 entering the infrared ray detecting unit 239, from the bending part 241.

The other constitution is same as in embodiment 1 shown in FIG. 1, and its effects are also the same as in embodiment 1. In addition, by defining the longitudinal direction of the displacement magnifying part extending from the bending part in the same direction as (parallel to) the running direction of the incident infrared ray, the infrared ray detecting unit can be located nearer to the infrared ray 240 than the binding part of the piezoelectric element adhering part and displacement magnifying part, and when driving as chopper, disturbance of traveling of the infrared ray 240 by vibration of the binding part 242 occurring simultaneously with vibration of the bending part can be prevented, so that the infrared ray may be detected more stably. Besides, by constituting alike, since the infrared ray detecting unit and sensor base can be arranged by overlapping with the longitudinal direction of the displacement magnifying part, the volume can be utilized effectively, and therefore the entire size of the sensor can be reduced. This constitution may be used similarly in any chopper having the features of embodiments 1 to 9, and brings about similar effects.

Figure 19:
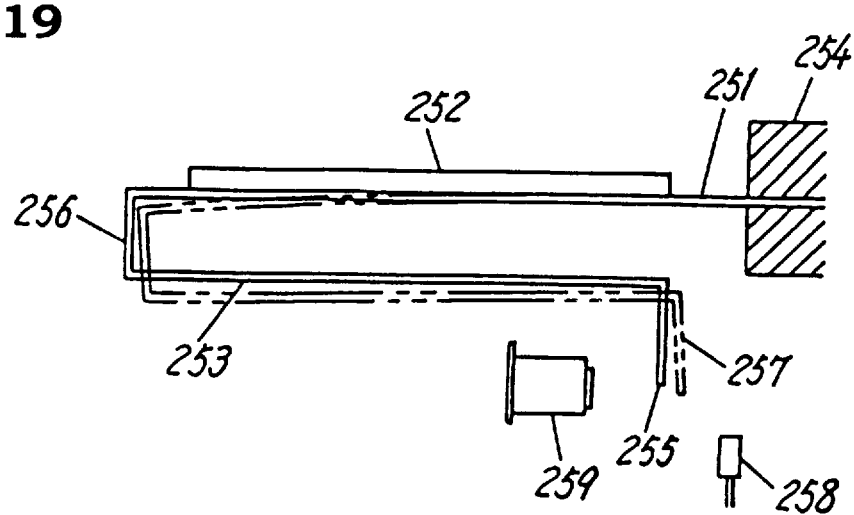
FIG. 19 is a schematic diagram showing a constitution of a pyroelectric type infrared ray sensor using the piezoelectric actuator in the tenth embodiment of the invention.
Figure 20A:
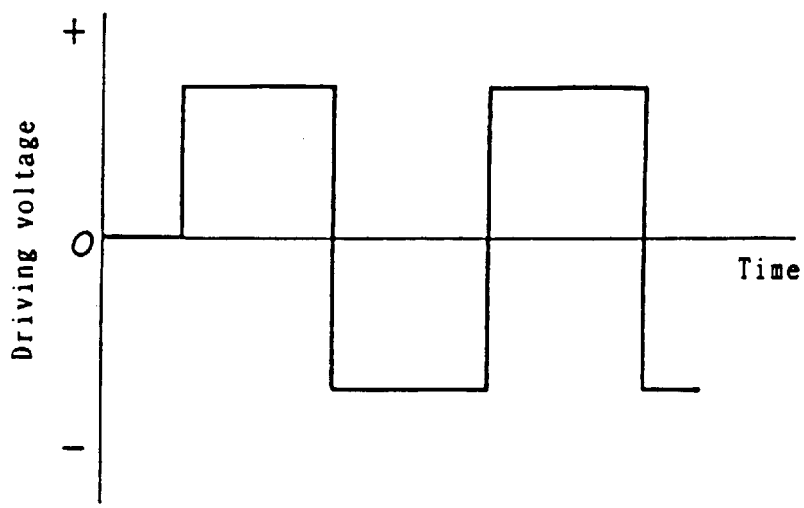
FIG. 20(a) is a driving waveform diagram in the same sensor.
Figure 20B:
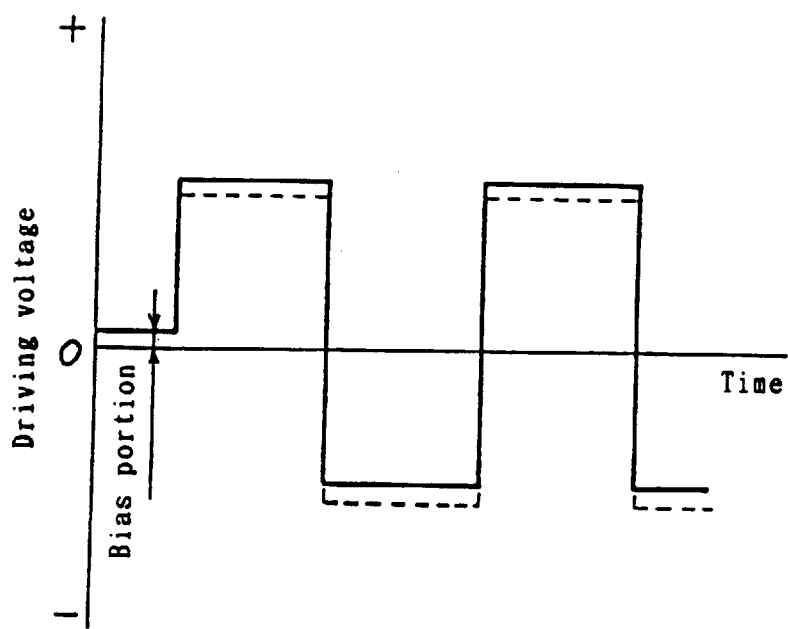
FIG. 20(b) is a driving characteristic diagram in the same sensor.

FIG. 19 and FIGS. 20 (a), (b) are schematic diagram, driving waveform diagram, and driving characteristic diagram showing an example of pyroelectric type infrared ray sensor using the unimorph type piezoelectric actuator in the tenth embodiment of the invention as the chopper.

In FIG. 19, reference numeral 251 is a shim, 252 is a piezoelectric element, 253 is a displacement magnifying part, 254 is a fixing piece, 255 is a bending part a, 256 is a binding part, 257 is a bending part b, 258 is a temperature detector, and 259 is an infrared ray detecting unit.

The piezoelectric actuator is composed of the shim 251, piezoelectric element 252, displacement magnifying part 253, fixing piece 254, bending part a 255, and binding part 256, same as in the tenth embodiment, and its resonance frequency and driving frequency are same. The infrared ray detecting unit 259 is composed by sealing an element for detecting the infrared ray in a cylindrical can and a window member which transmits infrared ray, and is provided near the bending part a 255, and by interrupting the incident infrared ray by the motion of the bending part a 255, it function as the chopper. The pyroelectric type infrared ray sensor is a sensor making use of temperature changes due to incident infrared ray, that is, the temperature difference can be detected and issued by the chopper and detecting unit alone, but the actual temperature of the object of measurement is not known. To know the actual temperature, accordingly, a temperature detector 258 such as thermistor is used. The temperature detector 258 is usually provided near the chopper, and measures the temperature of the chopper itself. The temperature change appearing in the detecting unit is due to the temperature difference of the chopper and the object of measurement, and by referring to the temperature of the chopper itself, the actual temperature of the object of measurement is known.

The unimorph type glued element of shim 251 and piezoelectric element 252 composing the chopper has an ordinary temperature characteristic, and hence generates warp due to difference in coefficient of thermal expansion of the shim 251 and piezoelectric element 252. That is, when the temperature around the chopper is raised from the initial state in FIG. 19, the chopper or the piezoelectric actuator generates a warp to the reverse side of adhesion of the piezoelectric element 252, and as a result, the bending part a 255 is moved to the bending part b 257. The displacement position during driving also depends almost on this move. Therefore, when the temperature around the chopper is changed, a change occurs in opening and closing of infrared ray, and it has an effect on the precision of temperature detection, which may be beyond an ignorable level sometimes. By contrast, in the method of raising the driving voltage and increasing the displacement until effect on temperature characteristic is eliminated, the effect of warp can be reduced. Besides, instead of raising the entire driving voltage, by changing the voltage only by correcting the amount moved by the temperature characteristic, the effect may be kept to a minimum limit.

FIGS. 20 (a) and (b) are characteristic diagrams showing an example of varying the driving voltage waveform to correct the temperature characteristic of the piezoelectric actuator of glued element type use as chopper. In FIGS. 20 (a) and (b), the axis of ordinates denotes the driving voltage and the axis of abscissas represents the time. FIG. 20 (a) is a waveform of ordinary rectangular wave drive, and it is intended to drive at equal voltages in both polarities, and the time of one period is same in both polarities. By contrast, FIG. 20 (b) is an example of driving voltages asymmetric in polarity by applying a positive bias. By the bias effect, the piezoelectric actuator always generates warp. That is, by making use of this phenomenon, by adjusting the driving voltage so as to generate warp at the opposite side of the warp caused by temperature characteristic, the both warps are canceled to displace at the original position. The pyroelectric type infrared ray sensor used in temperature detection possesses temperature detecting means of the chopper as mentioned above, and by making use of this measured temperature, the warp due to temperature characteristic can be effectively alleviated. For example, on the basis of the position of the front end portion at a certain temperature, when the moving amount of the front end portion due to change of ambient temperature is obtained preliminarily as information, the chopper warp can be canceled by giving the information of chopper measured temperature to the driving voltage and applying a necessary amount of bias. Alternatively, instead of applying bias, by varying the ratio of positive and negative voltages, similar effects are obtained. For instance, suppose the warp of the piezoelectric actuator of Super Invar in embodiment 1 is about 0.1 mm from 25° C. to 60° C. To cancel this, when a bias of 10 V is applied so as to displace in the opposite direction of the warp, the warp can be reduced about 0.05 mm. Furthermore, by simultaneously executing entire voltage change and asymmetric driving voltages, it has a greater effect on lessening of the effect of warp due to temperature characteristic. In the piezoelectric actuator of the invention, in particular, this adjustment is easy because the driving voltage is small and displacement is stable.

Since the pyroelectric type infrared ray sensor for temperature detection usually has temperature detecting means of chopper, it is not necessary to add an extra one, and by employing the above chopper driving method, the infrared ray can be opened and closed more stably, so that the precision pyroelectric type infrared ray sensor for temperature detection may be enhanced.

INDUSTRIAL APPLICABILITY

As described herein, the piezoelectric actuator of the invention is constituted by connecting a displacement magnifying part to the free end of a piezoelectric element adhering part gluing unimorph type or bimorph type, in which the front end of the displacement magnifying part is at a position closer to the fixing part than the front end portion of the piezoelectric element adhering part, and therefore by vibrating at the resonance frequency due to vibration of the piezoelectric element adhering part and the resonance frequency due to vibration of displacement magnifying part, brought closer to each other, the entire longitudinal dimension can be reduced. The pyroelectric type infrared ray sensor using this piezoelectric actuator as the chopper can be reduced in its entire size.

By bringing the resonance frequency due to vibration of the piezoelectric element adhering part and the resonance frequency due to vibration of the displacement magnifying part closer to each other, and driving the piezoelectric actuator at an intermediate frequency between the two frequencies, the displacement at the front end of the displacement magnifying part is magnified by the effects of both resonances. At the same time, at an intermediate frequency of the two resonance frequencies, there is a region of a relatively stable displacement amount, and by using this region for driving, it is possible to drive at low voltage. Therefore, instability of displacement in resonance is lessened, and a stable displacement characteristic may be obtained.

Furthermore, by setting the resonance frequency due to vibration of the displacement magnifying part at a higher value than the resonance frequency due to vibration of the piezoelectric element adhering part, a wider displacement is stabilized. At the same time, the region for keeping the time difference of the driving signal and displacement of displacement magnifying mechanism, almost constant in the above frequency region, can be extended, and therefore adjustment between the driving signal and displacement output will be easier.

By using this piezoelectric actuator as the chopper of pyroelectric type infrared ray sensor, along with expansion of displacement by utilization of resonance, the entire chopper shape is reduced in size. At the same time, since the displacement amount is stable, the chopper can be opened and closed stably, and the precision of sensor output may be enhanced. When seen in a long course of time, the reliability is increased.

In addition, by optimizing the elastic metal material for the constituent material of the piezoelectric actuator and the bending process dimension, it is possible to present a piezoelectric actuator maintaining a large displacement amount, having opening and closing frequency suited to the application as chopper for pyroelectric infrared ray sensor, small in effect on assembling fluctuation, and capable of producing stably. Moreover, by defining the driving frequency near the stable region of displacement and at higher frequency than the stable region, the displacement amount is hardly affected by the fixing position, and the load on the piezoelectric element adhering part can be reduced while driving. Therefore, crack or peeling of the piezoelectric element can be prevented, and the productivity and reliability may be further enhanced.

Still more, by varying the voltage for driving the piezoelectric actuator of the invention by the chopper temperature, a pyroelectric type infrared ray sensor for temperature detection free from effect by temperature is realized. In the piezoelectric actuator of the invention, the driving voltage is lower than in the piezoelectric actuator of glued element type using ordinary resonance, and the displacement is stable, and therefore the operation is very easy.

Moreover, the resonance frequency due to vibration of the piezoelectric element adhering part can be mainly lowered by forming a notch and hole near the fixing part of the piezoelectric element adhering part, fitting a weight near the front end of the piezoelectric element adhering part, or reducing the outer dimension toward the fixing part. By processing a hole at the front end of the displacement magnifying part, the value of resonance frequency due to vibration of displacement magnifying part can be raised. By these measures, the longitudinal dimension can be reduced more easily, and the resonance frequency due to vibration of the displacement magnifying part can be set at a higher value than the resonance frequency due to vibration of the piezoelectric element adhering part, so that a pyroelectric type infrared ray sensor of smaller size and higher precision may be realized.

What is claimed is:

1. A piezoelectric actuator comprising: a flat elastic element having two ends and two sides, and a flat piezoelectric element adhered to one side of said flat elastic element forming a piezoelectric element adhering part;

a fixing member for fixing one end of said flat elastic element, wherein the piezoelectric element adhering part produces a flexural motion through an application of an electric field to said flat piezoelectric element by vibrating said flat elastic element;

a displacement magnifying part having an end connected to the other end of said flat elastic element by a binding part, wherein said displacement magnifying part has a front end opposite said end of said displacement magnifying part connected to the binding part, said front end positioned nearer to said fixed end than to the binding part, wherein a resonance frequency f1 is generated due to a vibration of the piezoelectric element adhering part from the fixed end to the binding part, and a resonance frequency f2 is generated due to a vibration of the displacement magnifying part, wherein a difference exists between said resonance frequency f1 and said resonance frequency f2 and a driving frequency is intermediate of f1 and f2.

2. A piezoelectric actuator of claim 1, wherein the difference between f1 and f2 is within 25% of the higher of frequencies f1 and f2.

3. A piezoelectric actuator of claim 1, wherein the piezoelectric element adhering part and displacement magnifying part are composed of mutually independent separate members, and the piezoelectric element adhering part and displacement magnifying part are bound directly or through a different binding member near the end of the piezoelectric element adhering part.

4. A piezoelectric actuator of any one of claims 1 to 3, wherein said f2 is a higher frequency than said f1.

5. A piezoelectric actuator of claim 4, wherein the longitudinal dimension of the piezoelectric element adhering part is not more than 18 mm, said f2 is not more than 120 Hz, and the difference between f1 and f2 is within 20% of the higher of frequencies f1 and f2.

6. a piezoelectric actuator of claim 2, wherein a separate binding member is disposed between the piezoelectric element adhering part and displacement magnifying part, the piezoelectric element adhering part and displacement magnifying part are mutually bound through the binding member, and the binding member is positioned in part of the adhering region of the piezoelectric element adhered to the flat elastic member in the piezoelectric element adhering part, along a longitudinal dimension of the piezoelectric element adhering part.

7. A piezoelectric actuator of any one of claims 1 to 3, wherein said front end is an intermittent input means for an infrared ray entering an infrared ray sensor.

8. A piezoelectric actuator of claim 7, wherein the piezoelectric element adhering part and displacement magnifying part are bound mutually at an acute angle.

9. A piezoelectric actuator of claim 8, wherein the piezoelectric element adhering part and displacement magnifying part are bound mutually at an angle of within 40 degrees, and the vibrating frequency is not less than 50 Hz.

10. A piezoelectric actuator of claim 7, wherein the elastic member is bent in an arc shape to compose the piezoelectric element adhering part and displacement magnifying part.

11. A piezoelectric actuator of claim 7, wherein a weight is placed in the binding part between the piezoelectric element adhering part and the displacement magnifying part.

12. A piezoelectric actuator of claim 7, wherein a notch is formed in the flat elastic member, at or in the vicinity of, the fixed end of the piezoelectric element adhering part.

13. A piezoelectric actuator of claim 7, wherein a hole is formed in the flat elastic member, at or in the vicinity of, the fixed end of the piezoelectric element adhering part.

14. A piezoelectric actuator of claim 7, wherein a width of the piezoelectric element adhering part increases from the fixed end side to the binding part side with the displacement magnifying part, and a width of the displacement magnifying part decreases from the binding part side of the piezoelectric element adhering part to the front end portion of the displacement magnifying part.

15. A piezoelectric actuator of claim 7, wherein a hole is formed near said front end of the displacement magnifying part.

16. (Amended) A piezoelectric actuator of claim 7, wherein an element for detecting the infrared ray is positioned in a incident direction of the infrared ray, beyond both the binding part of the displacement magnifying part and the piezoelectric element adhering part, in a direction normal to the running direction of the infrared ray entering the infrared ray sensor.

17. A piezoelectric actuator of claim 7, wherein the displacement magnifying part is formed by bending the elastic member adhering the piezoelectric element in a pi-shape, near a front end of the piezoelectric element adhering part, wherein:

the elastic member is a metal material mainly composed of iron or copper, with the thickness ranging from 0.03 mm to 0.08 mm and a uniform width of 1 mm to 3 mm;

a dimension from the fixed end to the binding part by bending the front end through the piezoelectric element adhering part is 14 mm to 18 mm;

a dimension of the binding part positioned between the front end and the displacement magnifying part for binding the two in a direction at right angle to the piezoelectric element adhering part is 1.2 mm to 3 mm;

a dimension of the displacement magnifying part in the longitudinal direction is 11 mm to 15 mm;

a dimension of a member positioned at a front end opposite to the binding part of the displacement magnifying part having a right angle direction to the displacement magnifying part by bending said displacement magnifying part in a perpendicular direction is 3.5 mm to 6 mm;

a longitudinal dimension of the piezoelectric element adhered to the elastic member is 9 mm to 14 mm;

a thickness of the piezoelectric element is 0.05 mm to 0.12 mm;

a distance from the adhering position to the binding part is 0 mm to 2.5 mm; and said actuator drives at a frequency from 60 Hz to 140 Hz.

18. A piezoelectric actuator of claim 7, wherein:

the elastic member is 32Ni-5Co-Fe alloy with thickness of about 0.05 mm and width of 1.2 mm to 2.2 mm;

a dimension from the fixed end to the binding part at a front end through the piezoelectric element adhering part is 14.5 mm to 16.5 mm;

a dimension of the binding part positioned between the front end and the displacement magnifying part for binding the two in a direction at right angle to the piezoelectric element adhering part is 1.8 mm to 2.8 mm;

a longitudinal dimension of the displacement magnifying part is 12.5 mm to 14 mm;

the dimension of a member positioned at a front end opposite to the binding part of the displacement magnifying part having a right angle direction to the displacement magnifying part by bending the displacement magnifying part in a perpendicular direction is 3.8 mm to 4.8 mm;

a longitudinal dimension of the piezoelectric element adhered to the elastic member is 10 mm to 13 mm;

a thickness of the piezoelectric element is 0.05 mm to 0.12 mm;

a distance from the position of adhesion to the binding part is 0 mm to 2 mm; and said actuator drives at a frequency from 70 Hz to 100 Hz.

19. A piezoelectric actuator of claim 4, driven at either a frequency proximate to a minimum displacement occurring at an intermediate frequency between the resonance frequency f1 and the resonance frequency f2, or at a frequency higher than this frequency.

20. A piezoelectric actuator of claim 4, wherein a binding member positioned between the elastic member at a front end of the piezoelectric element adhering part and the displacement magnifying part for binding the two is positioned at a right angle or an acute angle to the angle formed with the piezoelectric element adhering part.

21. A piezoelectric actuator of claim 4, wherein a binding member positioned between the elastic member at a front end of the piezoelectric element adhering part and the displacement magnifying part for binding the two is positioned at a right angle or an acute angle to the angle formed with the displacement magnifying part.

22. A pyroelectric type infrared ray sensor comprising:

a temperature detecting means proximate to the piezoelectric actuator of claim 4; and a voltage varying means for varying a voltage value applied to the piezoelectric actuator corresponding to a detected temperature of the piezoelectric actuator by the temperature detecting means.

23. A pyroelectric type infrared ray sensor of claim 22, wherein the voltage and a driving waveform applied to the piezoelectric actuator are changed asymmetrically alternately in positive and negative polarity.

* * * * *